(12) United States Patent
Dalmia et al.

(10) Patent No.: US 11,233,018 B2
(45) Date of Patent: Jan. 25, 2022

(54) PACKAGE ON ANTENNA PACKAGE

(71) Applicant: INTEL CORPORATION, Santa Clara, CA (US)

(72) Inventors: Sidharth Dalmia, Portland, OR (US); Ana M. Yepes, Portland, OR (US); Pouya Talebbeydokhti, Chandler, AZ (US); Miroslav Baryakh, Petach-Tikva (IL); Omer Asaf, Oranit (IL)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/788,515

(22) Filed: Feb. 12, 2020

(65) Prior Publication Data
US 2020/0185342 A1    Jun. 11, 2020

Related U.S. Application Data

(63) Continuation of application No. 16/072,262, filed as application No. PCT/US2016/025503 on Apr. 1, 2016, now Pat. No. 10,566,298.

(51) Int. Cl.
*H01L 23/34* (2006.01)
*H01L 23/66* (2006.01)
(Continued)

(52) U.S. Cl.
CPC ............ *H01L 23/66* (2013.01); *H01L 21/563* (2013.01); *H01L 21/76877* (2013.01);
(Continued)

(58) Field of Classification Search
CPC ............ H01L 21/563; H01L 21/76877; H01L 23/552; H01L 23/66; H01L 23/5226;
(Continued)

(56) References Cited

U.S. PATENT DOCUMENTS 8,158,888 B2    4/2012 Shen et al.
8,624,775 B2    1/2014 Inami et al.
(Continued)

FOREIGN PATENT DOCUMENTS

JP        08-250913 A    9/1996

OTHER PUBLICATIONS

International Search Report issued in PCT/US2016/025503, dated Nov. 21, 2016, 2 pages.
(Continued)

*Primary Examiner* — Luan C Thai
(74) *Attorney, Agent, or Firm* — Eversheds Sutherland (US) LLP

(57) ABSTRACT

Wireless modules having a semiconductor package attached to an antenna package is disclosed. The semiconductor package may house one or more electronic components as a single die package and/or a system in a package (SiP) implementation. The antenna package may be communicatively coupled to the semiconductor package using by one or more coupling pads. The antenna package may further have one or more radiating elements for transmitting and or receiving wireless signals. The antenna package and the semiconductor package may have dissimilar number of interconnect layers and/or dissimilar materials of construct.

19 Claims, 11 Drawing Sheets

(51) Int. Cl.
    H01Q 1/22      (2006.01)
    H01L 23/552    (2006.01)
    H01L 21/56     (2006.01)
    H01L 21/768    (2006.01)
    H01L 23/31     (2006.01)
    H01L 23/522    (2006.01)
    H01L 23/00     (2006.01)
    H01Q 21/06     (2006.01)
    H01L 25/065    (2006.01)

(52) U.S. Cl.
    CPC ...... *H01L 23/3157* (2013.01); *H01L 23/5226* (2013.01); *H01L 23/552* (2013.01); *H01L 24/09* (2013.01); *H01Q 1/2283* (2013.01); *H01Q 21/065* (2013.01); *H01L 24/13* (2013.01); *H01L 24/16* (2013.01); *H01L 24/32* (2013.01); *H01L 24/48* (2013.01); *H01L 24/73* (2013.01); *H01L 24/92* (2013.01); *H01L 25/0655* (2013.01); *H01L 2223/6616* (2013.01); *H01L 2223/6677* (2013.01); *H01L 2224/131* (2013.01); *H01L 2224/13111* (2013.01); *H01L 2224/13147* (2013.01); *H01L 2224/16227* (2013.01); *H01L 2224/16235* (2013.01); *H01L 2224/32225* (2013.01); *H01L 2224/48227* (2013.01); *H01L 2224/73204* (2013.01); *H01L 2224/92125* (2013.01); *H01L 2224/97* (2013.01); *H01L 2924/14* (2013.01); *H01L 2924/1461* (2013.01); *H01L 2924/15174* (2013.01); *H01L 2924/15311* (2013.01); *H01L 2924/15313* (2013.01); *H01L 2924/15321* (2013.01); *H01L 2924/15331* (2013.01); *H01L 2924/15333* (2013.01); *H01L 2924/16152* (2013.01); *H01L 2924/16251* (2013.01); *H01L 2924/19105* (2013.01)

(58) Field of Classification Search
    CPC ... H01L 23/3157; H01L 24/09; H01Q 1/2283; H01Q 21/065
    USPC ........................................................ 257/728
    See application file for complete search history.

(56) References Cited

U.S. PATENT DOCUMENTS

| | | | |
|---|---|---|---|
| 9,356,352 B2 | 5/2016 | Seek et al. | |
| 9,620,464 B2* | 4/2017 | Baks | ...................... H01Q 19/10 |
| 10,566,298 B2* | 2/2020 | Dalmia | ................ H01L 21/563 |
| 10,985,465 B2* | 4/2021 | Singh | .................. H04B 5/0081 |
| 2003/0103006 A1 | 6/2003 | Yamada | |
| 2010/0159647 A1 | 6/2010 | To et al. | |
| 2012/0218161 A1 | 8/2012 | Rofougaran | |
| 2014/0111394 A1 | 4/2014 | Seek et al. | |
| 2015/0001732 A1 | 1/2015 | Malik et al. | |

OTHER PUBLICATIONS

Office Action for German Application No. 112016006695.3, dated Sep. 18, 2020, 12 pages (5 pages translation).

* cited by examiner

PACKAGE ON ANTENNA PACKAGE

CROSS REFERENCE TO RELATED APPLICATIONS

This application is a continuation of U.S. application Ser. No. 16/072,262, filed Jul. 24, 2018, which is a 371 National Phase application of PCT Application No. PCT/US2016/025503, filed Apr. 1, 2016. The disclosures of which are incorporated herein by reference in their entirety.

TECHNICAL FIELD

This disclosure generally relates to semiconductor packages, and more particularly to a package on an antenna package.

BACKGROUND

Integrated circuit(s) and other electronic devices may be packaged on a semiconductor package. The semiconductor package may be integrated onto an electronic system, such as a consumer electronic system. The package may include an antenna with an array of antenna radiating elements. The design latitude of the antenna, in this case, may be limited by the design needs of the rest of the semiconductor package, or vice-versa.

BRIEF DESCRIPTION OF THE FIGURES

Reference will now be made to the accompanying drawings, which are not necessarily drawn to scale, and wherein.

DETAILED DESCRIPTION OF EMBODIMENTS OF THE DISCLOSURE

Figure 1A:
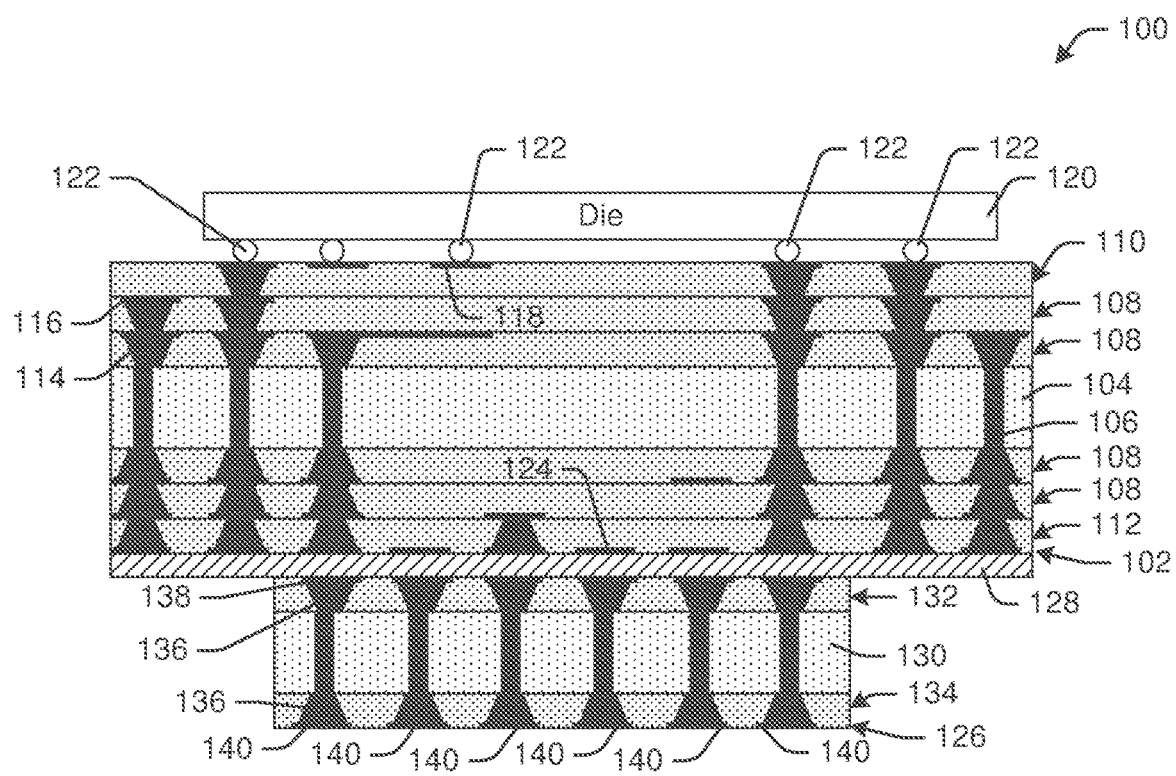
FIGS. 1A-1C depict a simplified cross-sectional schematic diagram of example wireless modules having die packages and antenna packages, in accordance with example embodiments of the disclosure.

Embodiments of the disclosure are described more fully hereinafter with reference to the accompanying drawings, in which example embodiments of the disclosure are shown. This disclosure may, however, be embodied in many different forms and should not be construed as limited to the example embodiments set forth herein; rather, these embodiments are provided so that this disclosure will be thorough and complete, and will fully convey the scope of the disclosure to those skilled in the art. Like numbers refer to like, but not necessarily the same or identical elements throughout.

The following embodiments are described in sufficient detail to enable at least those skilled in the art to understand and use the disclosure. It is to be understood that other embodiments would be evident based on the present disclosure and that process, mechanical, material, dimensional, process equipment, and parametric changes may be made without departing from the scope of the present disclosure.

In the following description, numerous specific details are given to provide a thorough understanding of various embodiments of the disclosure. However, it will be apparent that the disclosure may be practiced without these specific details. In order to avoid obscuring the present disclosure, some well-known system configurations and process steps may not be disclosed in full detail. Likewise, the drawings showing embodiments of the disclosure are semi-diagrammatic and not to scale and, particularly, some of the dimensions are for the clarity of presentation and may be exaggerated in the drawings. In addition, where multiple embodiments are disclosed and described as having some features in common, for clarity and ease of illustration, description, and comprehension thereof, similar and like features will ordinarily be described with like reference numerals even if the features are not identical.

The term "horizontal" as used herein may be defined as a direction parallel to a plane or surface (e.g., surface of a substrate), regardless of its orientation. The term "vertical," as used herein, may refer to a direction orthogonal to the horizontal direction as just described. Terms, such as "on," "above," "below," "bottom," "top," "side" (as in "sidewall"), "higher," "lower," "upper," "over," and "under," may be referenced with respect to the horizontal plane. The term "processing" as used herein includes deposition of material or photoresist, patterning, exposure, development, etching, cleaning, ablating, polishing, and/or removal of the material or photoresist as required in forming a described structure.

In accordance with example embodiments of the disclosure, wireless modules may have a semiconductor package and an antenna package. The semiconductor package may have one or more electrical components (e.g., integrated circuit (IC) dies, radio frequency ICs (RFICs), surface mount devices (SMDs), etc.) disposed thereon. The antenna package may have radiating elements of an antenna provided thereon. The antenna elements may be of any suitable type, such as patch antennas, stacked patches, dipoles, monopoles, etc., and may have different orientations and/or polarizations. In example embodiments, the antenna package may be constructed of different materials than the semiconductor package. For example, the antenna module may use higher dielectric constant (high-k)/tunable/ultra low-k/metamaterials/magnetic materials. In example embodiments, the antenna package and the semiconductor package may have dissimilar numbers of build-up and/or interconnect layers. For example, the semiconductor package may have six build-up layers and the antenna package may include a single layer dielectric strip. In example embodiments, the antenna package may be attached to the semiconductor package by any suitable mechanism, such as by epoxy, adhesives, glue, tape, lamination, soldered connections, and/or metallic bonding. Additionally, the main package may be constructed using relatively thinner layers, while the antenna package may be constructed using relatively much thicker materials. In example embodiments, where the antenna package is attached to the semiconductor package using epoxy, I/O pads of the semiconductor package may be coupled to I/O pads of the antenna package inductively and/or capacitively. The antenna package may be smaller or larger in size than the main RFIC carrier. The antenna package itself may have several components mounted/soldered thereon which are connected electrically and/or electromagnetically with the main RFIC carrier.

In some further example embodiments according to the disclosure, the semiconductor package and the antenna package may be coupled to each other via a printed circuit board (PCB) on which both the semiconductor package and the antenna package are disposed. In still further example embodiments, the semiconductor package may have a plurality of antenna radiating elements disposed thereon. These radiating elements may be picked-and-placed on the semiconductor substrate. The pick and placed components may be soldered on and make physical electrical connection or couple electromagnetically. In some embodiments, part of the structure may be contained in the main RFIC package and part in the secondary/tertiary antenna package. In yet further example embodiments, radiating elements may be disposed on a sidewall of a printed circuit board (PCB) on which the semiconductor package is disposed. In these example embodiments, the signals to be wirelessly transmitted from an RFIC on the semiconductor package may be transmitted via traces of the PCB to the radiating elements provided on the sidewall of the PCB. The side walls may have monopoles, folded dipoles, or spiral antennas made using vias and/or edge plated walls or castellations that function as radiating elements.

According to example embodiments, the semiconductor package may include a substrate. In some cases, the package substrate may be an organic structure. In other cases, the package substrate may be inorganic (e.g., ceramic, glass, etc.). The package substrate may, in example embodiments, include a core layer with one or more interconnect layers built up on one or both sides of the core layer. The build-up layers, as built up on the core, may have interconnects formed therein. The interconnects may provide electrical pathways for signals between electronic components (e.g., integrated circuits, passive devices, etc.), input/output (I/O) connections on the semiconductor package, signal fan out from/to the electronic components, signal connections between two or more electrical components, power delivery to electrical component(s), ground connections to electrical component(s), clock signal delivery to the electrical component(s), combinations thereof, or the like. The build-up layers may be fabricated on one or both sides of the package core. In some cases, there may be the same number of build-up layers on both sides of the package core. In other cases, the build-up layers formed on either side of the package core may be asymmetric. The stack-up may also be asymmetric by having different layer thicknesses on either side of the core. Furthermore, the core of the semiconductor package may have a plurality of through vias to make electrical connections from one side of the core to the other side of the core. Thus, through vias in the core may allow electrical connections between one or more build-up layers on the top of the semiconductor package to one or more build-up layers on the bottom of the semiconductor package. In some alternative embodiments, a coreless substrate may be used. In some cases, the package substrate may have no core or called coreless substrate. The layers in the substrate can be disparate, and of different thicknesses. It is possible for such a package to have components embedded in them, such as Si/packaged Si, and/or other SMT components.

One or more electronic components, including at least one integrated circuit die, may be electrically and mechanically coupled to the package substrate via any suitable mechanism, such as metal pillars (e.g., copper pillars), flip chip bumps, solder bumps, any type of low-lead or lead-free solder bumps, tin-copper bumps, wire bonds, wedge bonds, controlled collapse chip connect (C4), anisotropic conductive film (ACF), nonconductive film (NCF), combinations thereof, copper pillar or the like. In some example embodiments, the dies (e.g., integrated circuits) that are packaged in the semiconductor package, as described herein, may have input/output (I/O) connections for various sizes. For example, a particular die may have finer pitch I/O connections than another die packaged on the semiconductor package. In some example embodiments, the build-up layers on the bottom of the core may have one or more input/output (I/O) connections between the semiconductor package and a board. In other example embodiments, build-up layers on the top of the semiconductor package may have one or more package-to-board interconnects. Semiconductor package-to-board level interconnects may be provided on one or both sides of the package substrate. In example embodiments, the semiconductor package-to-board level interconnects may be ball grid array (BGA) connections, other area connections, periphery connections, or the like. The semiconductor component may also be pre-packaged as a wafer level chip scale package (WL-CSP), embedded wafer level ball grid array (e-WLB), flip chip-chip scale package (FC-CSP).

In example embodiments, the antenna package may also include a substrate. The antenna package may, on one side, have interconnect structures for receiving and/or sending wireless signals from/to the semiconductor package. For example, such interconnect structures may be metal interconnects between pads on the antenna package and pads on the semiconductor package. Thus, in these example embodiments, the antenna package may be coupled to the semiconductor package by conductive contacts. Examples of such metallic, conductive connections may include flip-chip connections, metal (e.g., copper) pillar, solder bumps, any type of low-lead or lead-free solder bumps, anisotropic conductive film (ACF), or any other suitable connections between the antenna package and the semiconductor package. In other example embodiments, the pads on the antenna package may be aligned to corresponding pads on the semiconductor package and attached using epoxy and/or adhesives (e.g., adhesive tape). In these cases, the epoxy may be sufficiently thick that leakage current therethrough may be relatively negligible. Thus, when using epoxy and/or adhesive to attach the antenna package to the semiconductor package, the signals (e.g., RF signals) between the semiconductor package and the antenna package may be inductively and/or capacitively coupled. For example, if a pad of the antenna module is separated from a corresponding pad of the semiconductor module with a dielectric epoxy disposed therebetween, the reactance of either of the pads may be sufficient to transmit the signal from one pad to the other using electromagnetic fields generated by one or the other pad. In some example embodiments, the epoxy and/or adhesive joining the semiconductor package to the antenna package may be relatively thick, such as greater than 10 microns (μm). In some example embodiments, the epoxy may have a relatively high dielectric constant (high-k), such that there is sufficient reactance-based coupling between pads on the antenna package and corresponding pads on the semiconductor package.

In example embodiments, in addition to a mechanism for coupling to the semiconductor package, the antenna package may have a mechanism for radiating electro-magnetic signals (e.g., RF wireless signals). The antenna package may have one or more radiating elements disposed thereon that may radiate the wireless signals, as received from the semiconductor package. Additionally, the antenna package may have radiative reception elements that may receive electro-magnetic signals that may be routed to the semiconductor package (e.g., to RFICs disposed on the semiconductor package). In some example embodiments, the antenna package may include a single interconnect layer having both the coupling elements (e.g., pads) to the semiconductor package and the radiative elements (e.g., receiving and/or transmitting radiative elements). In some example embodiments, the antenna package may have an area that is less than an area of the package substrate. In other example embodiments, the antenna package may have an area that is greater than the semiconductor package.

In example embodiments, the antenna package may be assembled on the opposing side of the semiconductor package as the electronic components. In this case, an interposer may be disposed on the same surface as the electronic components. This interposer may have a greater height than the integrated circuits disposed on the semiconductor package. The interposer may serve to route signals from the semiconductor package through a thickness of the interposer to a side of the interposer that is opposing the side of the interposer that is placed in contact and/or in proximity to the semiconductor package. The interposer may be used to attach the semiconductor package to a PCB. In this way, signals from the semiconductor package may be provided to/from the PCB via the interposer disposed on the same side as one or more electronic components on the semiconductor package. Furthermore, the antenna package may be provided on the semiconductor package on an opposing side of the interposer. The interposer, in example embodiments, may be constructed of organic materials and/or inorganic materials. In some example cases, the interposer may be constructed from a relatively rigid material (e.g., silicon, ceramics, glass, etc.). In other example cases, the interposer may be constructed in a similar manner as the semiconductor package, such as for example with a core layer and build-up layers (e.g., pre-preg, metal) on one or both sides of the core layer. The interposer, in example embodiments, may have through-vias (e.g., through-vias in a core layer, stacked vias in a coreless organic interposer, through-silicon vias (TSVs) in a silicon interposer, etc.).

In example embodiments, the wireless module having a semiconductor package on an antenna package may be such that the antenna package is disposed on a side opposing a side of the semiconductor package on which one or more electrical components (e.g., RFICs, SMDs, etc.) are mounted. Molding may be formed on the side of the semiconductor package having the electronic components. Next, holes (e.g., vias), may be formed in the molding, such that the holes are aligned to make contact to corresponding pads on the surface of the semiconductor package. Next, the holes may be filled with a conductive material (e.g., electroplated copper, electroless copper, aluminum, conductive paste, solder paste, etc.), such that a portion of the conductive material protrudes past a top surface of the molding. In this way, the protrusions may form a mechanism for package-to-board interconnection. For example, protruding pillars from the surface of the molding may be used to form contacts to a PCB in a manner similar to using solder balls or contact pillars. When the package is mounted to a PCB in this manner by using through-molding contacts, the semiconductor package may have contact with the antenna package on the side opposing the molding. In some example embodiments, additional vias and/or trenches may be formed in the molding to enclose on or more electronic components provided on the semiconductor package surface. In this way electromagnetic interference (EMI) shielding may be formed in the molding. In some cases, such an EMI shielding may be formed at the same time as forming the through-molding contacts.

In some example embodiments, radiative elements may be assembled directly on a surface of the semiconductor package. In these embodiments, a pick-and place mechanisms may be used to place and electrically and/or mechanically bond each of the radiative elements on the surface of the semiconductor package. Thus, the radiative elements may be pre-fabricated and placed after and/or during the assembly of the semiconductor package. In example embodiments, the radiative elements may be assembled directly on a surface of the semiconductor package and there may be an antenna package attached to the semiconductor package. In other words, there may be radiative elements provided on both sides (e.g., antenna package on the bottom surface and assembled radiative elements on the top surface) of the semiconductor package.

It will be appreciated that by forming an antenna package separately from the semiconductor package, greater design latitudes, lower costs, reduced form factor, greater manufacturing yield, and/or better performance may be achieved for both the semiconductor package. If the antenna package and the semiconductor package were integrated in the same package, both elements may be forced to having the number and type of core and/or build-up layers (e.g., pre-preg dielectric layers, metal layers, etc.), with the same thicknesses, dielectric constants, and other properties. By dividing out the antenna package and the semiconductor package, each element may be manufactured with materials, structure, and/or processes that may be relatively optimal for that element. For example, the semiconductor package may be manufactured with eight layers of interconnect (e.g., four build-up layers on either side of the core) to accommodate routing to, from, and in between a plurality of dies provided on the semiconductor package, such as in SiP-type implementation. The antenna package, on the other hand, in this example, may only have a single layer (e.g., a strip of dielectric with pad interfaces on one side and radiating elements on the other side). It would be appreciated that forcing the antenna package to be integrated with the semiconductor package may result in the antenna portion of an integrated package to have a number of routing layers, and all that extra materials and processing, that may be eliminated by separating the semiconductor package from the antenna package. Additionally, the antenna package may be forced to use the dielectric and/or metal materials chosen for the semiconductor package, if an integrated package was to be formed. Of course, alternatively, the semiconductor package may be forced to use the dielectric and/or metal materials that are used for the antenna element in an integrated package. Therefore, by separating out the semiconductor package from the antenna package, in non-limiting examples, a low-k dielectric may be used in the semiconductor package to route signals with reduced parasitics (e.g., reduced resistive-capacitive (RC) delays), while relatively higher-k materials may be employed in the antenna package to enable reduced form factor antennas. Furthermore, thinner dielectric layers may be chosen for the semiconductor package since they may result in tightly bound fields, minimizing undesired radiation and coupling from transmission lines; and thicker dielectric layers may be chosen for the antenna package to provide better efficiency, loosely bound fields for improved radiation into space, and/or greater bandwidth. Further still, it will be appreciated that by building smaller package substrates, by using the structures, apparatus, systems, and methods, as disclosed herein, the each of the semiconductor package and the antenna package may have a smaller area and fewer processes individually, resulting in potential manufacturing yield advantages.

Figure 1B:
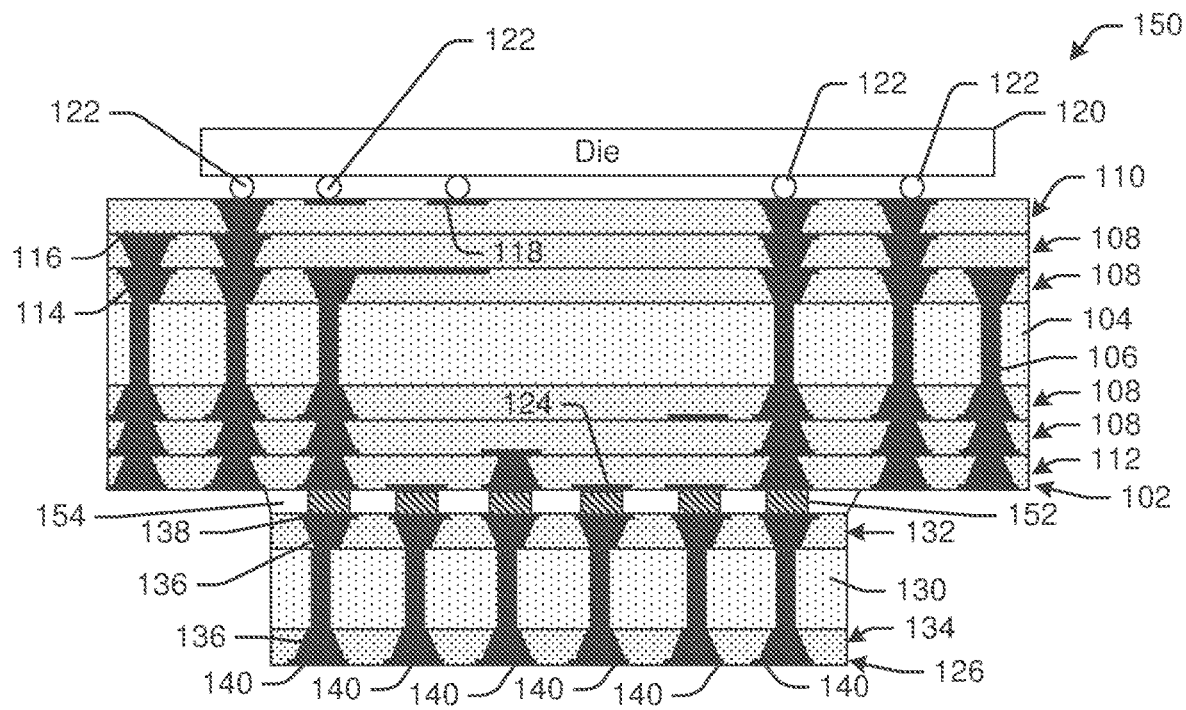
Figure 1C:
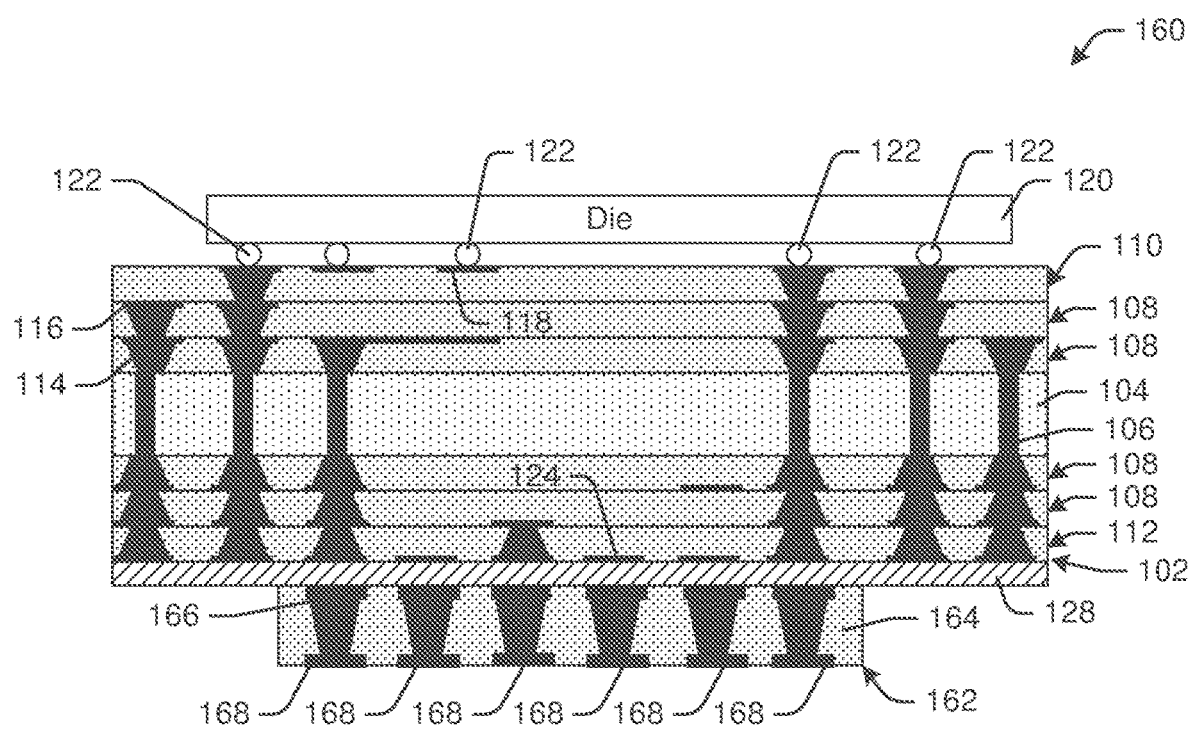

FIGS. 1A-1C depict a simplified cross-sectional schematic diagram of example wireless modules 100, 150, 160 having die packages 102 and antenna packages 126, 162, in accordance with example embodiments of the disclosure.

The wireless module 100 of FIG. 1A may include a semiconductor package 102, with a core 104 having one or more through-vias 106, and one or more build-up layers 108, 110, 112. The build-up layers 108, 110, 112 may have one or more vias 114 and/or metallic traces 116 formed therein to route signals, ground, and/or power throughout the semiconductor package 102. A top build-up layer 110 may have one or more pads 118 thereon onto which die 120 with die-to-package interconnects 122 may be connected. The semiconductor package 102 may further have pads on a bottom build-up layer 112 which may be used to interface with an antenna package 126 attached to the semiconductor package 102 via epoxy and/or adhesive 128. The antenna substrate may include a core layer 130, and build-up layers 132, 134. The build-up layers may include vias 136 and metallic traces 138, 140. The metallic trace 138 in a top build-up layer 138 of the antenna package 126 may interface with corresponding pads 124 of the semiconductor package 102 to send and/or receive signals to and/or from, respectively, the semiconductor package 102. The metallic trace 140 of a bottom build-up layer 134 of the antenna package 126 may include antenna elements (e.g., radiating elements and/or reception elements).

In example embodiments, semiconductor package core 104 and/or antenna core 130 on which build-up layers 108, 110, 112, 132, 134 may be of a size greater than the size of the package substrate 102 and/or the antenna substrate 126. In other words, the package substrate 102 and/or the antenna substrate 126 may be singulated into separate semiconductor packages and/or antenna packages after completing other fabrication processes in a batch fashion with other package substrates on the same panel. The package core 102 and/or antenna core 130 may be of any suitable size and/or shape. For example, the package core 102 and/or antenna core, in example embodiments, may be a rectangular panel. In example embodiments, the cores 104, 130 may be fabricated of any suitable material, including polymer material, ceramic material, plastics, composite materials, glass, epoxy laminates of fiberglass sheets, FR-4 materials, FR-5 materials, combinations thereof, or the like. The cores 104, 130 may have through vias 106 formed therein. Through vias 106 may be used for propagating electrical signals from the top of the package core 104, 130 to the bottom of the package core 104, 130, and vice versa. It will be appreciated that in some example embodiments, the core 104 material may be the same as core 130 material. In other example embodiments, the core 104 of the semiconductor package 102 and core 130 of the antenna package may be of different materials.

The build-up layers 108, 110, 112, 132, 134 may have dielectric materials and electrical connections 114, 116, 124, 136, 138, 140 (e.g., vias, pads, traces, etc.) thereon. The semiconductor package coupling pads 124 and the antenna package coupling pads 138 may have a relatively greater area compared to other electrical connections 114, 116, 138.

The build-up layers 108, 110, 112, 132, 134 or interconnect layer may be formed by a variety of suitable processes. Dielectric material may be laminated on the semiconductor package core 104 and/or antenna package core 130. In example embodiments, the dielectric laminate may be any suitable material, including polymer material, ceramic material, plastics, composite materials, liquid crystal polymer (LCP), epoxy laminates of fiberglass sheets, prepreg, FR-4 materials, FR-5 materials, combinations thereof, or the like. In some example embodiments, the package core 104, 130 and the build-up dielectric material 108, 110, 112, 132, 134 may be the same type of material. In other example embodiments, the package core 104, 130 and the build-up dielectric material 108, 110, 112, 132, 134 may not be constructed of the same material type. Vias and/or trenches may be patterned in the build-up layer using any suitable mechanism, including photolithography, plasma etch, laser ablation, wet etch, combinations thereof, or the like. The vias and trenches may be defined by vertical and horizontal metal traces, respectively, within the build-up layer 102. The vias and trenches may then be filled with metal, such as by electroless metal plating, electrolytic metal plating, physical vapor deposition, combinations thereof, or the like. Excess metal may be removed by any suitable mechanism, such as etch, clean, polish, and/or chemical mechanical polish (CMP), combinations thereof, or the like.

It will be appreciated that the number of build-up layers in the semiconductor package 102 may be different from the number of build-up layers in the antenna package 126. Although the semiconductor package 102 is shown with six layers of interconnect (e.g., three build-up layers 108, 110, 112 on either side of the core 104), it will be understood that there may be any suitable number of interconnect layers. It will further be appreciated that the number of build-up layers on either side of the core 104 may be asymmetric in some cases. Similarly, the antenna package 126 may also have any suitable number of build-up layers and may have an asymmetric build-up on either side of the core 130. In fact, in some example embodiments, the antenna package may include a single layer of radiative elements (e.g., patch antenna radiative elements), coupled to corresponding pads of the semiconductor package 102. Although the antenna package 130 is shown as having less area than the semiconductor package 102, it will be appreciated that according to example embodiments, the semiconductor package 102 and the antenna package of the wireless module 100 may have any suitable relative area. It will be appreciated that due to the antenna package 126 being fabricated separately from the semiconductor package 102, the number of layers of build-up and materials selected may be tuned specifically to the applications of each of the semiconductor package 102 and the antenna package 126. For example, low-k pre-preg layers may be used in the semiconductor package 102 to allow for high-frequency, low signal degradation signaling. On the other hand, high-k materials may be used for the antenna package 126 to enable miniaturization of the radiative elements 140. In example embodiments, the dielectrics used in the semiconductor package 102 and/or antenna package 126 may have k values in the range of about 2 to about 9. In example embodiments, build-up layers may include dielectric layers with a thickness in the range of about 25 microns ($\mu$m) to about a few 100 $\mu$m and metal layers in the range of about 10 $\mu$m to about 40 $\mu$m.

The die 120 may be attached by any suitable mechanism. The die 120 may be any suitable electronic components including, but not limited to, integrated circuits, surface mount devices, active devices, passive devices, diodes, transistors, connectors, resistors, inductors, capacitors, microelectromechanical systems (MEMSs), combinations thereof, or the like. The die 120 may be electrically and mechanically coupled to the corresponding pads 118 of the semiconductor package 102 via any suitable die-to-package interconnect 122, such as metal pillars (e.g., copper pillars), flip chip bumps, solder bumps, any type of low-lead or lead-free solder bumps, tin-copper bumps, wire bonds, wedge bonds, controlled collapse chip connect (C4), anisotropic conductive film (ACF), nonconductive film (NCF), combinations thereof, or the like. In some example embodiments, the type of contact may be different for dies mounted on the semiconductor package 102. For example, one die may have copper pillar contacts and another die may have solder bump contacts. In other example embodiments, different dies mounted on the semiconductor package 102 may have the same type of contacts (e.g., all dies have copper pillar contacts). In some cases, underfill (e.g., with or without filler materials) may be provided between the die 120 and the semiconductor package 102, such as surrounding die-to-package interconnects 122.

The semiconductor package 102 may be mechanically coupled to the antenna package 126 via any suitable mechanism, such as epoxy, adhesives, tape, mechanical holders, metal contacts, or the like. In example embodiments, the epoxy may be deposited onto one of the semiconductor package 102 or the antenna package 126. Next, the other of the semiconductor package 102 and the antenna package 126 may be aligned and placed on the package 102, 126 having the epoxy thereon. This alignment and placement mechanism may be achieved using a pick-and place tool, such as a tool that uses optical alignment to align objects to be bonded to each other. Next the epoxy may be cured to form the epoxy-based attachment of the semiconductor package 102 to the antenna package 126. It will be appreciated that the curing of the epoxy may drive cross-linking and/or hardening of the epoxy material. In some cases, B-stage epoxy may be used for staging the semiconductor package to the antenna package and then a curing process may be used for a final cure of the B-stage epoxy. In other example embodiments, adhesives or tape may be disposed on one or the other of the semiconductor package 102 or the antenna package 126, and the other of the semiconductor package 102 or the antenna package 126 may be aligned and placed. In example embodiments, the epoxy/adhesive/tape 128 may be selected to desirable properties in the coupling between pads 124 of the semiconductor package 102 and the pads 138 of the antenna package 126.

In some cases, electrical components may be provided on the antenna package 126. For example, inductors, capacitors, and/or resistors may be disposed on the antenna package 126. By placing these components on the antenna package 126, processing steps for the semiconductor package 102 may be reduced. Additionally, overall areal and/or volumetric reductions (e.g., relatively desirable form factor) may be realized by not only placement of discrete components on the antenna package, but also from separating the antenna portion and the die portions into separate packages.

The wireless module 150 of FIG. 1B may include a semiconductor package 102 and an antenna package 126, similar to wireless module 1A of FIG. 1A. However, in FIG. 1B, the antenna package 126 may be attached to semiconductor package 102 using one or more metallic contacts 152 between coupling pads 124 on the semiconductor package side and the coupling pads 138 on the antenna package side. The one or more metallic contacts may include any suitable materials including, but not limited to copper, lead-tin solder, lead-free solder, any tin-based solder, tin-copper alloys and/or intermetallics, aluminum, alloys, intermetallics, and/or combinations thereof, or the like. In some example embodiments, the metallic contacts may be solder-based contacts that may be relatively easy to assemble after fabricating each of the semiconductor package 102 and the antenna package 126. It will be appreciated that in some example embodiments, having a metal contact 152 between corresponding pads 124, 138 may provide for improved signal transmission therebetween.

In some example embodiments, underfill 154 may be provided between the semiconductor package 102 and the antenna package 126. The underfill may surround the contacts 152, pads 124, and/or pads 138. Underfill epoxy may be dispensed by a nozzle under and/or adjacent to antenna package 126 and/or semiconductor package 102. The underfill epoxy may move by capillary action and/or Van der Waals forces into the placement shown.

Representative underfill epoxy materials may include an amine epoxy, imidazole epoxy, a phenolic epoxy or an anhydride epoxy. Other examples of underfill material include polyimide, benzocyclobutene (BCB), a bismalleimide type underfill, a polybenzoxazine (PBO) underfill, or a polynorbornene underfill. Additionally, the underfill epoxy may include one or more suitable filler materials, such as silica. In example embodiments, the underfill epoxy may have fillers and/or other materials therein to preferentially control the coefficient of thermal expansion (CTE), reduce stresses, impart flame retardant properties, promote adhesion, and/or reduce moisture uptake in the underfill epoxy. Additives and/or chemical agents may be included in the underfill epoxy for desirable properties, such as a preferred range of viscosity, a preferred range of tackiness, a preferred range of hydrophobicity (e.g., surface wetting), a preferred range on particle suspension properties, a preferred range of cure temperatures, combinations thereof, or the like.

The underfill epoxy may be cured to form the underfill 154. The cure process may include heating and/or radiation (e.g., ultraviolet (UV) cure, and/or combinations thereof). During the cure process, the underfill epoxy may cross-link and harden. Although the underfill epoxy is depicted with a relatively straight sidewall, it will be appreciated that in some example embodiments, the underfill epoxy may have a fillet with a curved sidewall. Additionally, underfill epoxy residue may remain in portions of the semiconductor package substrate 102 surface where the underfill epoxy may have been originally deposited.

The wireless module 160 of FIG. 1C may include a semiconductor package 102 similar to wireless module 100 of FIG. 1A and an antenna package 162 that may be a single layer antenna package. In this example embodiment, the antenna package may include a single dielectric layer 164 and the material for the dielectric layer 164 may be similar to core or build-up layer dielectric material. In example embodiments, the dielectric layer 164 may be any suitable material, including polymer material, ceramic material, plastics, composite materials, LCP, epoxy laminates of fiberglass sheets, prepreg, FR-4 materials, FR-5 materials, combinations thereof, or the like. Coupling pads 166 may be provided for electrically coupling (e.g., inductively, capacitively, and/or conductively, etc.) with pads 124 of the semiconductor package. The antenna package 162 may further have a plurality of radiative elements 168, such as, for example, antenna elements that are configured to receive and/or transmit signals wirelessly. In example embodiments, the signals received via the coupling pads 166 may be transmitted wirelessly via the radiative elements 168. In the same or different embodiments, wireless signals received via the radiative elements 168 may be provided to the coupling pads 166 such that those signals may be received by the semiconductor package and/or the die 120 (e.g., RFIC) thereon.

It will be appreciated that the coupling between the antenna package 126, 162 and the semiconductor package may use any suitable mechanism other than epoxy 128 or metal contacts 152. According to example embodiments, adhesives, tape, glue, and/or lamination, or indeed any suitable joining mechanism may be used to attach the semiconductor package 102 and the antenna package 126, 162. Although in this disclosure one of the aforementioned joining mechanisms may be depicted for illustrative purposes, it will be noted that any of the other joining mechanisms may be substituted in accordance with example embodiments of the disclosure. It should also be understood that in the following descriptions that semiconductor package 102 and/or the antenna package may have any suitable number of interconnect layers. For example, even if an antenna package resembling antenna package 126 is depicted in a particular configuration, it should be appreciated that a different configuration of the antenna package, such as antenna package 162, may be substituted in that particular depiction without deviating from embodiments of the disclosure.

Although a single antenna package is shown, it will be understood that in some example embodiments, two or more antenna packages may be provided with a semiconductor package. For example, a first antenna package may be disposed on one side of a semiconductor package and a second antenna package may be disposed on a second side of the semiconductor package. In some cases, having more than one antenna package disposed on a semiconductor package may improve wireless module performance, such as by having a greater unidirectional wireless transmit/receive performance In other words, having an antenna package on either side of a semiconductor package may provide improved uniformity of power density in reception and/or transmission over a full 360°.

Figure 2A:
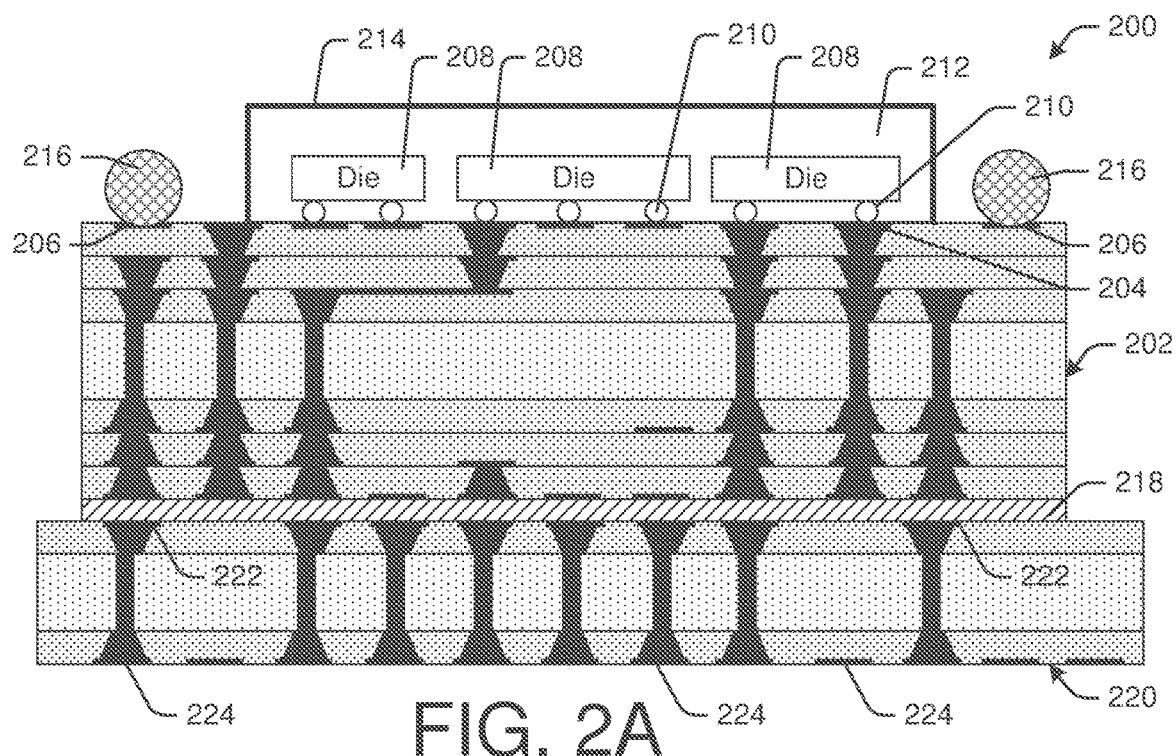
FIGS. 2A and 2B depict simplified cross-sectional schematic diagrams illustrating another configuration of a wireless module having an antenna package and a die package with package-to-board interconnects disposed on a same side as one or more dies, in accordance with example embodiments of the disclosure.
Figure 2B:
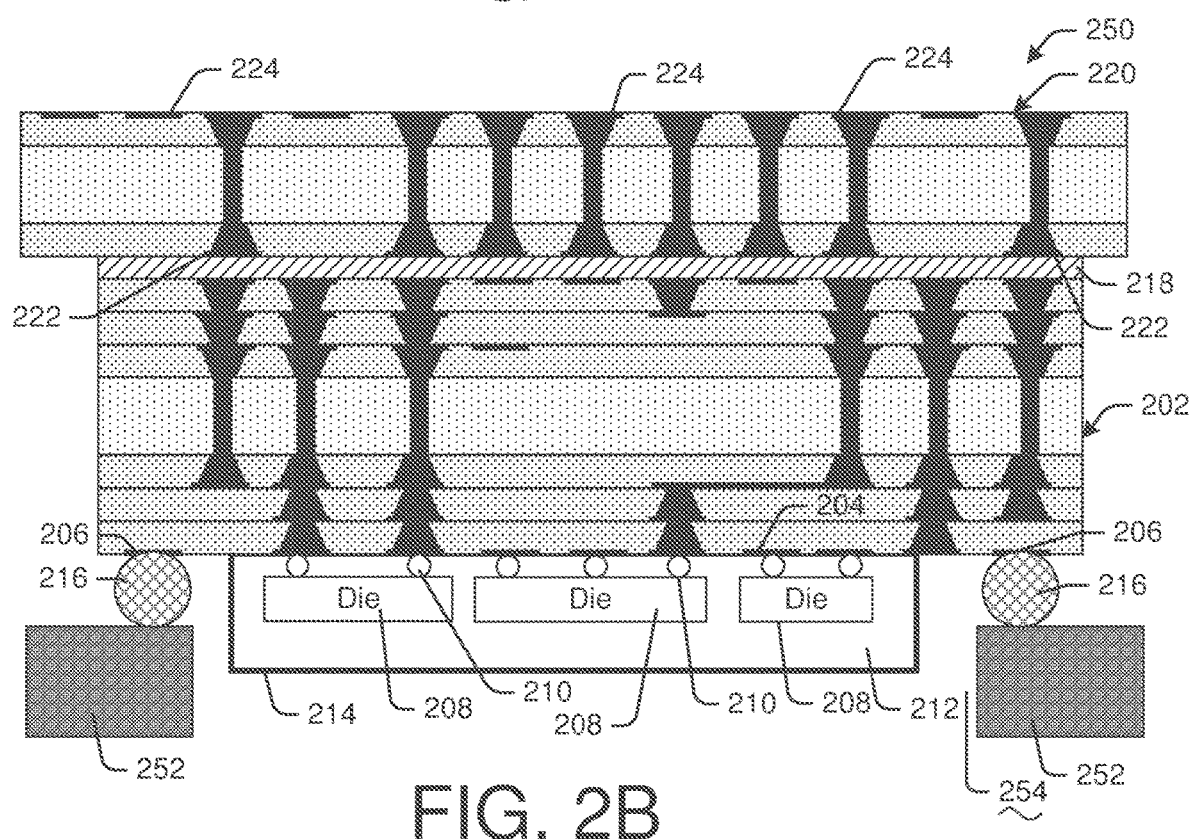

FIGS. 2A and 2B depict simplified cross-sectional schematic diagrams illustrating another configuration of a wireless module 200, 250 having an antenna package 220 and a die package 202 with package-to-board interconnects 216 disposed on a same side as one or more dies 208, in accordance with example embodiments of the disclosure.

The die package 202 may include a number of interconnections as described in conjunction with FIGS. 1A-1C. The interconnections may further include one or more pads 204, 206. Some of the pads 204 may be for making contact to dies 208 that may be disposed on the die package 202. As discussed above, the dies 208 may be any suitable die (RFIC, low noise amplifier (LNA), wireless baseband, microcontroller, etc.) and may be attached using any suitable interconnect 210 and/or mechanism (e.g., flip-chip, copper pillar, ACF, NCF, etc.). Pads 206 may be the same size or different size from pads 204, and may be used to contact package-to-board interconnects 216. The package-to-board interconnects 216 may be of any suitable type including, for example, ball grid array (BGA), land grid array (LGA), or any other suitable package-to-board interconnect. The dies 208, in example embodiments, may be surrounded by molding 212 and/or an electromagnetic interference (EMI) shield 214 and or lid. The EMI shielding 214 may be any suitable shielding mechanism, such as a metal can.

The molding material may be any suitable molding material for forming molding 212. For example, the molding material may be a liquid dispensed thermosetting epoxy resin mold compound. A mold compound may be deposited on the surface of the semiconductor packaging substrate 202 using any suitable mechanism, including, but not limited to, liquid dispense, spin coating, spray coating, combinations thereof, or the like. In some example embodiments, the molding compound may be provided within the EMI shield 214 or lid which is then picked and placed over the dies 208. The mold compound, after being disposed onto the top surface of the semiconductor package 202, may be cured. Upon curing (e.g., cross-linking), the deposited molding compound may harden and form molding 212 to adhere to the semiconductor package 202 and encapsulating the dies 208. In example embodiments, the molding 212 may have fillers and/or other materials therein to preferentially control CTE, reduce stresses, impart flame retardant properties, promote adhesion, and/or reduce moisture uptake in the molding 212. The molding 212, in example embodiments, may be any suitable thickness. For example, the molding 212 may be approximately 1 millimeter (mm) thick. In other cases, the molding 212 may be approximately in the range between about 200 microns (μm) and 800 μm thick. In yet other cases, the molding 212 may be approximately in the range between about 1 mm and 2 mm thick.

The antenna package 220 is depicted here as having an area greater than the area of the die package 202. However, it will be understood that the relative sizes of the die package 202 and the antenna package 220 may be any suitable ratio. The die package 220 may have coupling pads 222 to send/receive signals from the die package 202 and may have radiative elements 224 for transmitting and/or receiving wireless signals (e.g., RF signals). The antenna package 220 may be joined with the die package 202 using epoxy 218, as described above. The epoxy may be of any suitable thickness and/or material properties to effectively couple signals from the die package 202 to/from the antenna package 220. It will be appreciated that any alternative joining mechanism may be used (e.g., adhesives, glue, metallic bonding, lamination, etc.) to couple the die package 202 with the antenna package, in accordance with example embodiments of the disclosure.

The wireless module 200 may be provided on a PCB 252, in example embodiments, by attaching the package-to-board interconnects 216 to corresponding pads (not shown) on the PCB 252. The PCB 252 may optionally have a cavity 254 formed therein to accommodate the height of the dies 208, die-to-package interconnects 210, molding 212, and/or EMI shield 214. Thus, in this configuration of wireless module 250, the antenna package 220 may be disposed on an opposing side of the semiconductor package 202 than the PCB 252 on which the wireless module 200 is mounted.

Figure 3:
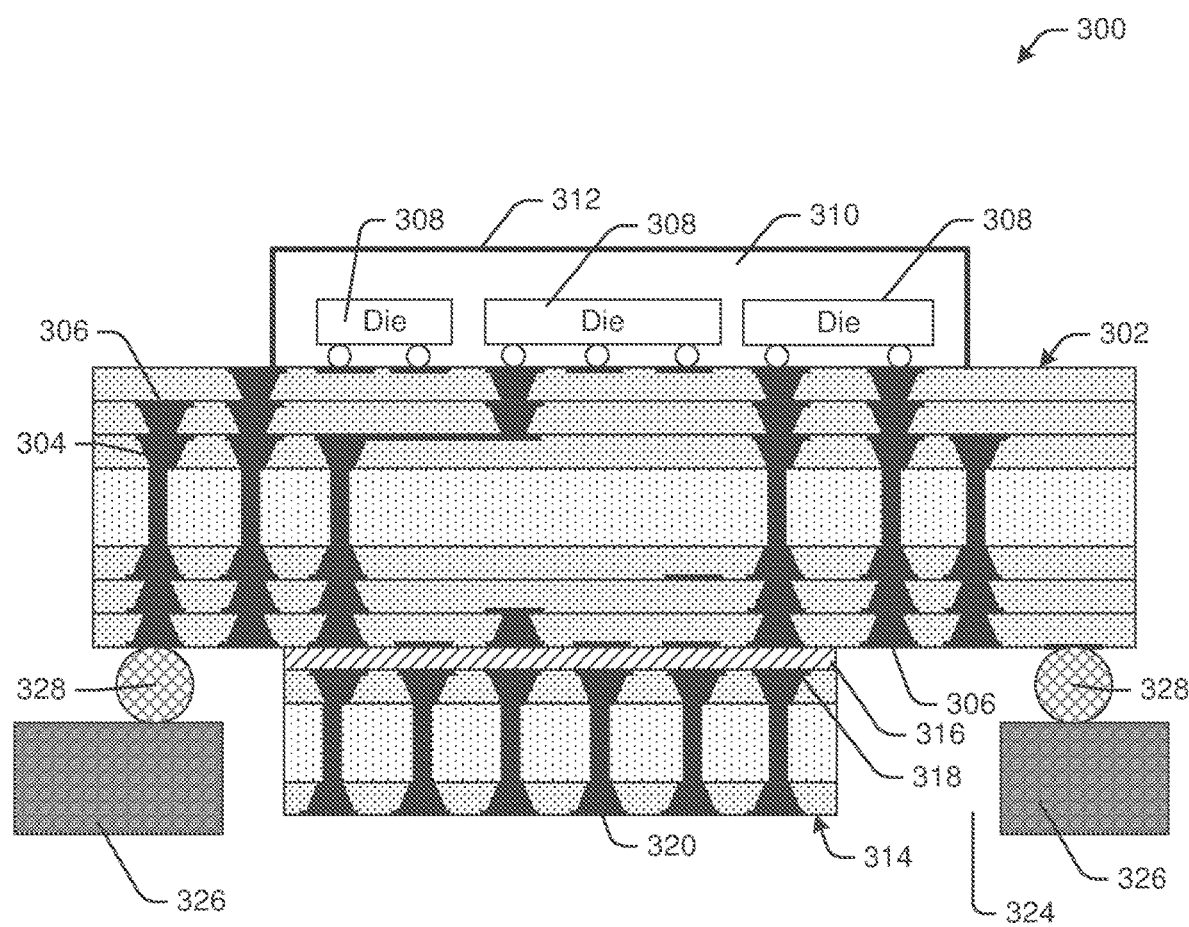
FIG. 3 depicts a simplified cross-sectional schematic diagram illustrating a configuration of a wireless module having an antenna package and a die package with package-to-board interconnects disposed on the same side as the antenna package, in accordance with example embodiments of the disclosure.

FIG. 3 depicts a simplified cross-sectional schematic diagram illustrating a configuration of a wireless module 300 having an antenna package 314 and a die package 302 with package-to-board interconnects 328 disposed on the same side as the antenna package 314, in accordance with example embodiments of the disclosure. Similar to the die package 202 of FIG. 2, die package 302 may include a number of interconnections 304,306 as described in conjunction with FIGS. 1A-1C. As discussed above, the dies 308 may be any suitable die (RFIC, low noise amplifier (LNA), wireless baseband, microcontroller, etc.) and may be attached using any suitable interconnect and/or mechanism (e.g., flip-chip, copper pillar, ACF, NCF, etc.). The dies 308, in example embodiments, may be surrounded by molding 310 and/or an electromagnetic interference (EMI) shield 312. The EMI shielding 312 may be any suitable shielding mechanism, such as a metal can. The antenna package 314 may have coupling pads 318 and radiating elements 320 and may be attached to the die package 302 using any suitable mechanism, such as epoxy 316. Package-to-board interconnects 328 may be formed on the die package 302 on the same surface on which the antenna package is disposed. The package-to-board interconnects 328 may be of any suitable type including, for example, ball grid array (BGA), land grid array (LGA), or any other suitable package-to-board interconnect. The package-to-board interconnects 328 may be used to make electrical contact to a PCB 326. In some cases, the PCB 326 may have a void or cavity 324 to accommodate the height of the antenna module 314.

Figure 4:
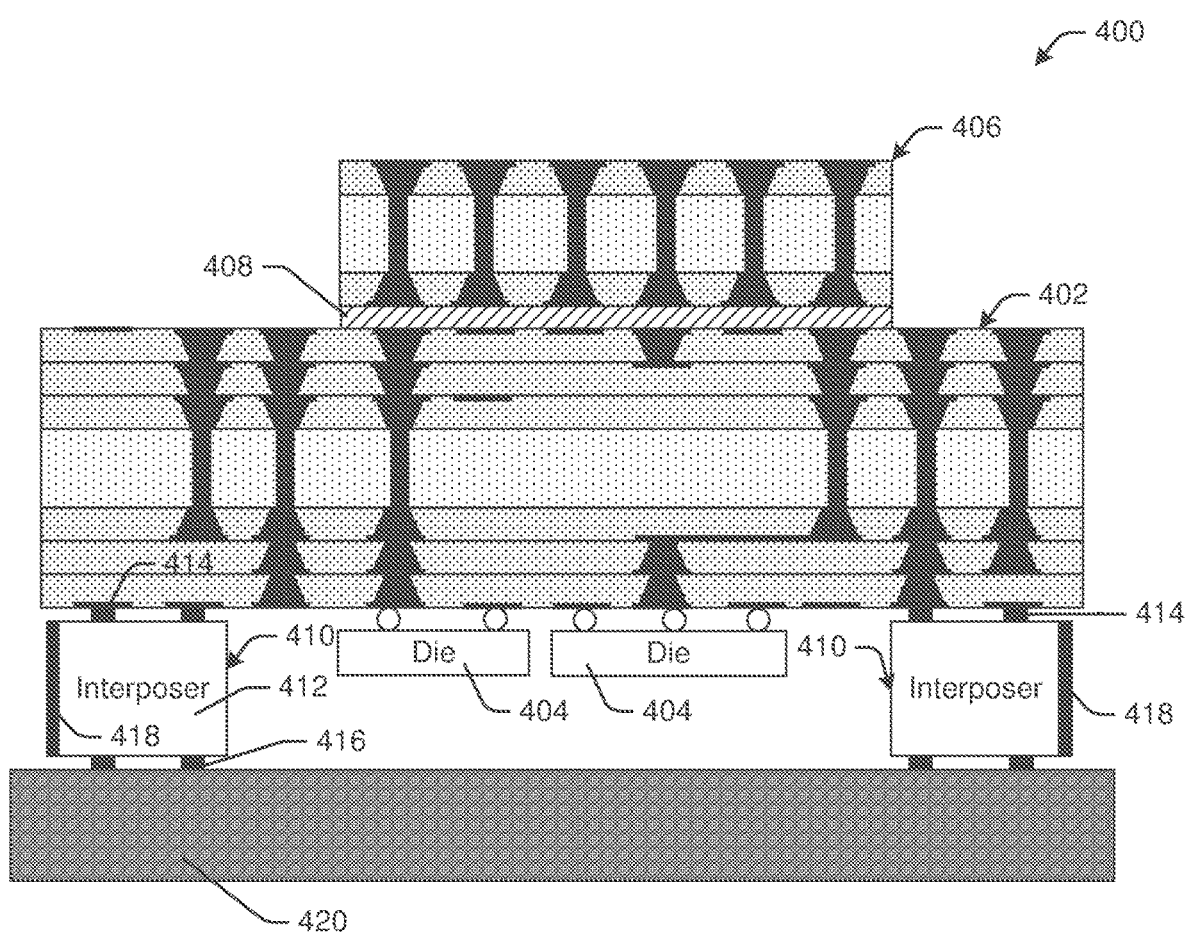
FIG. 4 depicts a simplified cross-sectional schematic diagram illustrating a configuration of a wireless module having an antenna package and an interposer interface, in accordance with example embodiments of the disclosure.

FIG. 4 depicts a simplified cross-sectional schematic diagram illustrating a configuration of a wireless module 400 having an antenna package 406 and an interposer interface 410, in accordance with example embodiments of the disclosure. The dies 404 may be any suitable die (RFIC, low noise amplifier (LNA), wireless baseband, microcontroller, etc.) and may be attached to a semiconductor package 402 using any suitable interconnect and/or mechanism (e.g., flip-chip, copper pillar, ACF, NCF, etc.). The antenna package 406 may have coupling pads and radiating elements and may be attached to the die package 402 using any suitable mechanism, such as epoxy 408. According to example embodiments, the interposer 410 may be disposed on the same surface of the semiconductor package 402 as the dies 404. This interposer 410 may have a greater height than the dies 404 disposed on the semiconductor package 402. The interposer 410 may serve to route signals from the semiconductor package 402 through a thickness of the interposer 410 to a side of the interposer that is opposing the side of the interposer that is placed in contact and/or in proximity to the semiconductor package 402. The interposer may be used to attach the semiconductor package 402 to a PCB 420. In this way, signals from the semiconductor package may be provided to/from the PCB 420 via the interposer disposed on the same side as dies 404 on the semiconductor package. The interposer 410, in example embodiments, may be constructed of organic materials and/or inorganic materials. In some example cases, the interposer 410 may be constructed from a relatively rigid material (e.g., silicon, ceramics, glass, etc.). In other example cases, the interposer 410 may be constructed in a similar manner as the semiconductor package 402, such as for example with a core layer and build-up layers (e.g., prepreg, metal) on one or both sides of the core layer. The interposer 410, in example embodiments, may have through-vias (e.g., through-vias in a core layer, stacked vias in a coreless organic interposer, through-silicon vias (TSVs) in a silicon interposer, etc.). In example embodiments, the interposer 410 may have a void therein to accommodate the dies 404 disposed on the same semiconductor package surface as the interposer 410. The interposer may have one or more interconnects 414 with the semiconductor package 402. The interconnects 414 may be of any suitable type and/or dimension. The interconnection 414 may use any suitable mechanism (e.g., copper pillar, flip-chip, etc.). The interconnection 416 between the interposer 410 and the PCB 420 may further be of any suitable type and/or mechanism (e.g., copper pillar, flip-chip, etc.). In some cases the interposer 410 may have electrically conductive material 418 disposed thereon. The electrically conductive material may be electroplated, electroless plated, provided as a conductive paste, or the like, on sidewalls of the interposer 410. The conductive material may serve as an EMI shield during operation of the wireless module 400.

Figure 5:
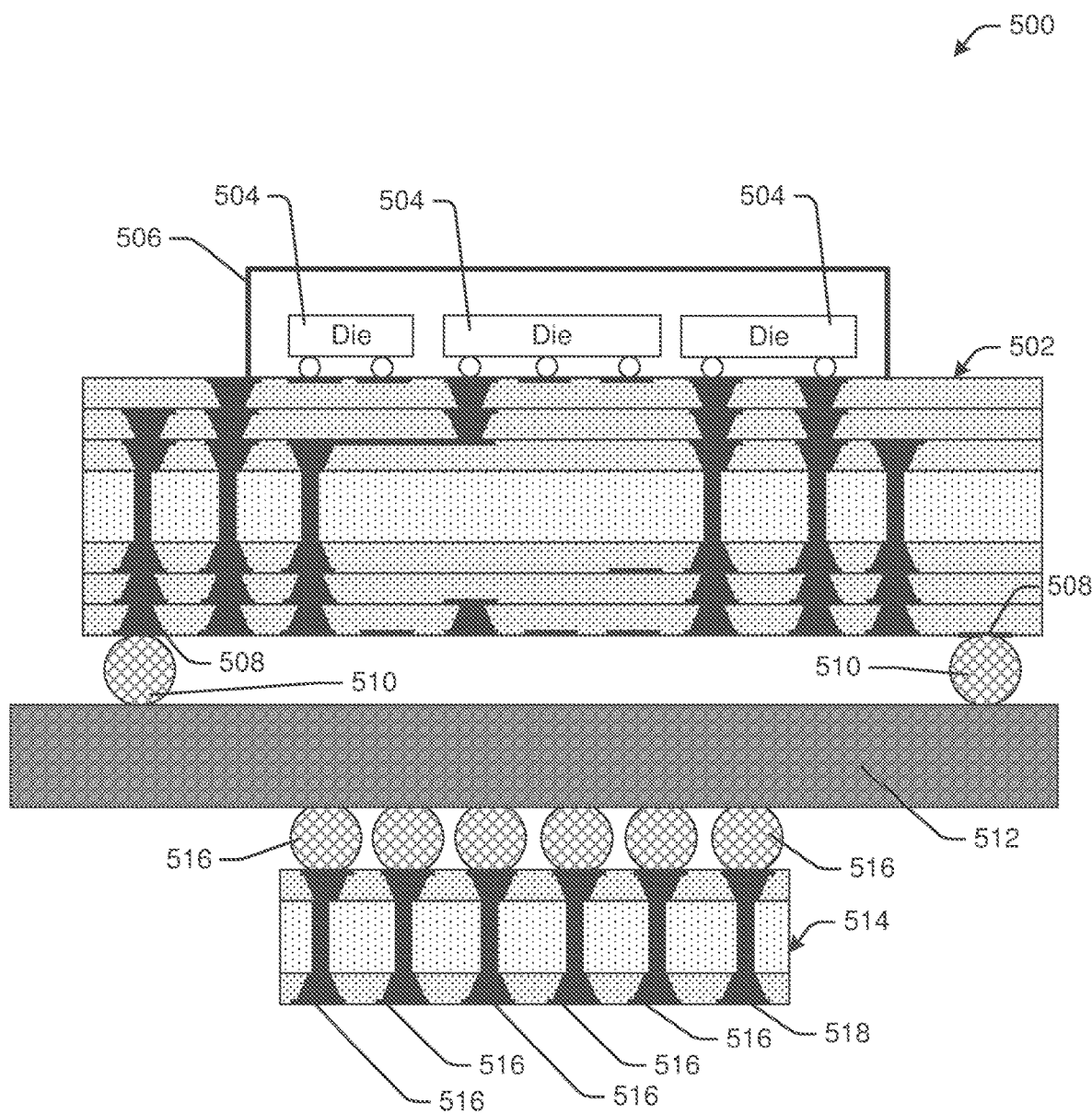
FIG. 5 depicts a simplified cross-sectional schematic diagram illustrating a configuration of a wireless module having an antenna package coupled to a semiconductor package via a printed circuit board, in accordance with example embodiments of the disclosure.

FIG. 5 depicts a simplified cross-sectional schematic diagram illustrating a configuration of a wireless module 500 having an antenna package 514 coupled to a semiconductor package 502 via a printed circuit board (PCB) 512, in accordance with example embodiments of the disclosure. The semiconductor package may have one or more dies 504 disposed thereon. The semiconductor package may further optionally have EMI shielding 506 around one of more of the dies 504. According to example embodiments, one or more semiconductor package-to-board interconnects 510 may be fabricated on corresponding pads 508 of the semiconductor package 502. The package-to-board interconnects 510 may be of any suitable type including, for example, ball grid array (BGA), land grid array (LGA), or any other suitable package-to-board interconnect. The package-to-board interconnects 510 may route signals between the semiconductor package 502 and the PCB 512. Some of those signals may be routed to/from the antenna package 514 via the PCB 512. The antenna package may have antenna package-to-board interconnects 512 to receive and/or send signals from/to the PCB 512, such as for example, signals being communicated from/to the semiconductor package 502. The antenna package 514 may include a plurality of radiating elements 518 for transmitting and/or receiving wireless electro-magnetic signals.

Figure 6A:
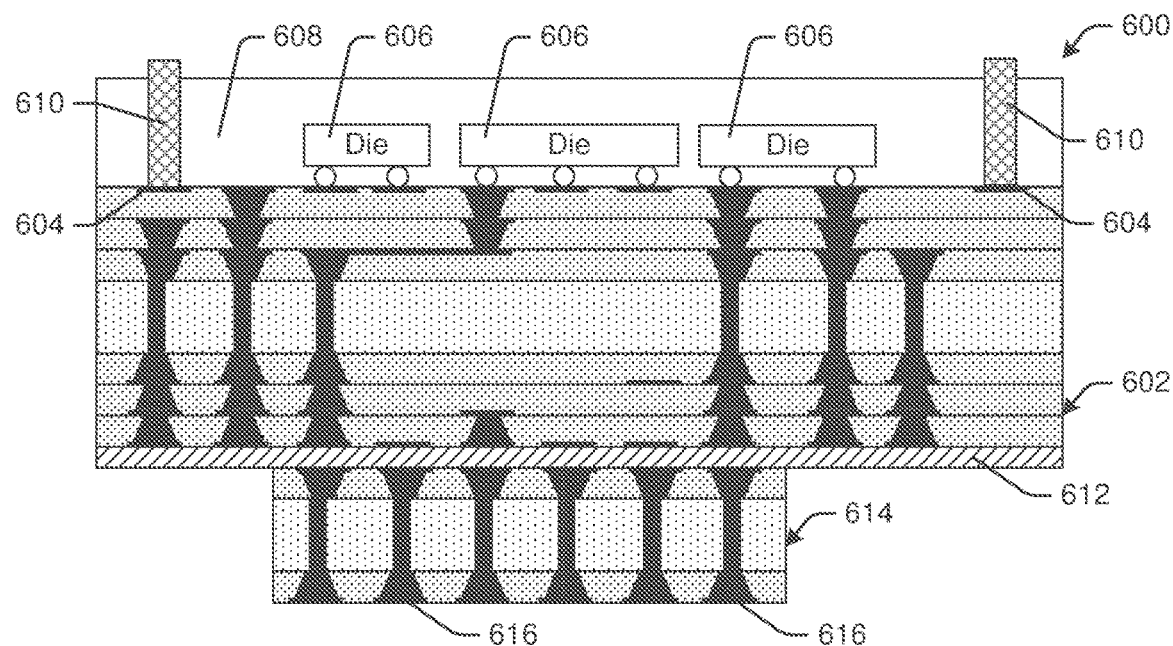
FIGS. 6A and 6B depict simplified cross-sectional schematic diagrams illustrating a configuration of a wireless module having an antenna package and having through-molding contacts, in accordance with example embodiments of the disclosure.
Figure 6B:
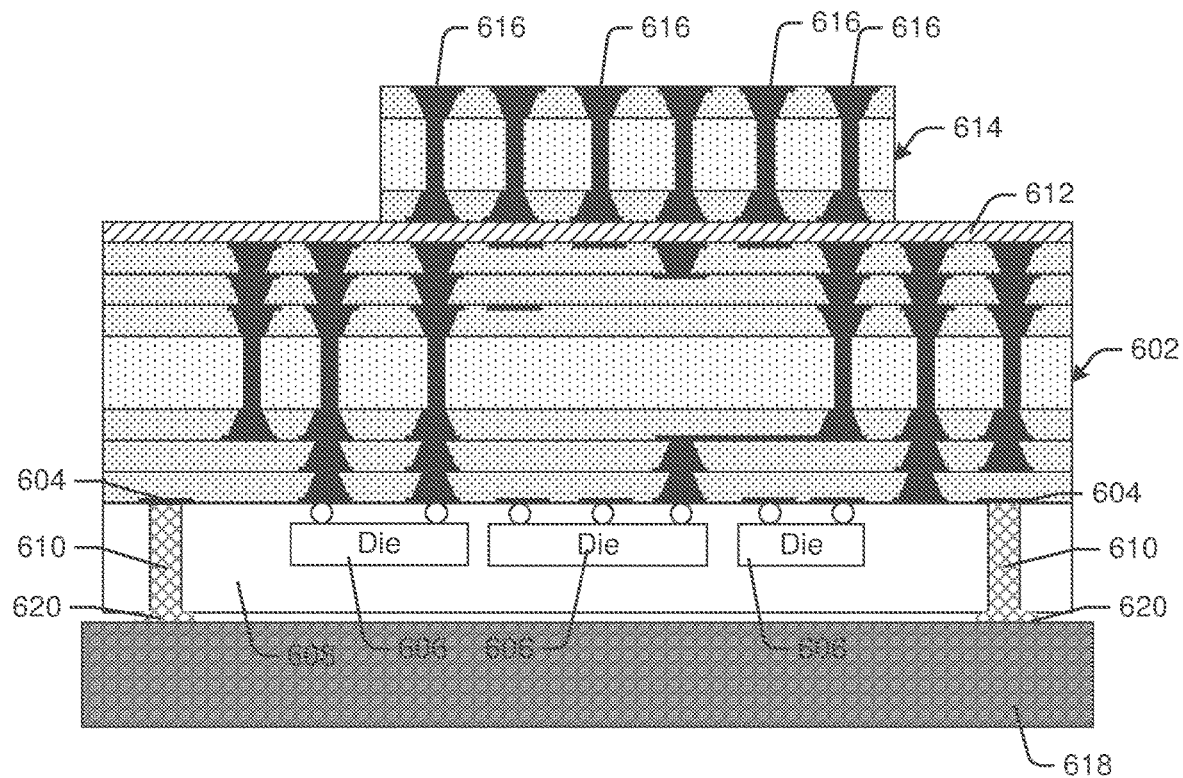

FIGS. 6A and 6B depict simplified cross-sectional schematic diagrams illustrating a configuration of a wireless module having an antenna package 614 and having through-molding contacts 610, in accordance with example embodiments of the disclosure. A semiconductor package 602 may be coupled with the antenna package 614 using any suitable mechanism, such as epoxy 612. The semiconductor package 602 and the antenna package 614 may be coupled in a manner such that signals (e.g., RF signals) may be passed therebetween. The antenna package 614 may further have one or more radiating elements 616 from which wireless signals may be transmitted and/or received. The semiconductor package 602 may have one or more dies 606 packaged thereon. The dies 606 may be encapsulated in molding 608 and through-molding interconnects 610 may be provided for carrying signals to and/or from the semiconductor package 602 via pads 604. The through-molding interconnects 610 may be used for making an electrical connection between the wireless module 600 and a PCB 618. The connections may result in an interconnect formation 620 between the wireless module 600 and the PCB 618. In some cases, the though-molding interconnect 610 may deform to form the contact 620 between the wireless module 600 and the PCB 618. In other example embodiments, other mechanisms for connecting the wireless module 600 and the PCB 618 may be provided. Such mechanisms may include elements such as copper pillars, solder interconnects, conductive paste interconnects, interconnects using ACF, NCF, combinations thereof, or the like.

Molding 608 may be formed on the side of the semiconductor package 602 having the dies 606. A mold compound may be deposited on the surface of the semiconductor package 602 using any suitable mechanism, including, but not limited to, liquid dispense, spin coating, spray coating, combinations thereof, or the like. The mold compound, after dispense onto the top surface of the semiconductor package 602, may be cured. In some example embodiments, the mold compound may be cured while pressure is applied thereon by a chase surface. In example embodiments, the chase (e.g., a relatively flat surface pressed on top of the liquid molding material disposed on top of the semiconductor package substrate) may itself be heated. Upon curing (e.g., cross-linking) the deposited molding compound may harden and form molding 602 to adhere to the semiconductor package 602 and encapsulating the dies 606. In example embodiments, the molding 608 may have fillers and/or other materials therein to preferentially control CTE, reduce stresses, impart flame retardant properties, promote adhesion, and/or reduce moisture uptake in the molding 608. The molding 608, in example embodiments, may be any suitable thickness. For example, the molding 608 may be approximately 1 millimeter (mm) thick. In other cases, the molding 608 may be approximately in the range between about 200 microns (μm) and 800 μm thick. In yet other cases, the molding 608 may be approximately in the range between about 1 mm and 2 mm thick.

Next, holes (e.g., vias) and/or trenches may be formed in the molding 608, such that the holes are aligned to make contact to corresponding pads 604 on the surface of the semiconductor package 602. The holes and/or trenches may be formed by any variety of suitable processes, such as, light amplification by stimulated emission of radiation (laser) ablation, dry etching, embossing, plasma etching, and/or wet etching. In laser ablation processes, a laser frequency and laser power may be selected such that there is relatively efficient transference of energy to the molding 608 for relatively effective ablation of the B stage epoxy and molding 608. The width of the holes and/or trenches may be any suitable width. In some cases, the trenches 112 may be approximately 500 μm in width. In other case, the trench widths may be approximately in the range of about 100 μm to 500 μm.

In example embodiments, the holes and/or trenches in the molding 608 may be formed such that the bottom of the holes and/or trenches open up to pads 604 and/or traces of the semiconductor package 602. In some example embodiments, the mechanism (e.g., laser ablation, etching, etc.) used for opening up the trenches may be selective in removing the molding material relative to the material (e.g., copper, aluminum, etc.) of the pad 604. In some example embodiments, the formation of the holes and/or trenches 610 may entail an initial removal of molding 608, followed by a cleaning of the holes and/or trenches. The initial removal of the molding material may be by any suitable process (e.g., laser ablation, photolithography, dry etching, wet etching, embossing, etc.). This initial removal may, in example embodiments, leave residue (e.g., molding residue, etch by-product residue, etc.). The subsequent cleaning process may also be any suitable process (e.g., laser ablation, photolithography, dry etching, wet etching, embossing, etc.). In example embodiments, the initial removal process may be a different type (e.g., laser ablation, photolithography, dry etching, wet etching, embossing, etc.) of process than the subsequent cleaning process. For example, a laser ablation initial removal process may be followed by a flash wet etch process to form the holes and/or trenches in the molding 608. In other example embodiments, the initial removal process may be the same type of process as the subsequent cleaning process, but with different parameters. For example, a high powered laser ablation process may be followed by a lower power laser ablation process. In yet further example embodiments, the initial removal process may be the same as a subsequent process. Of course, in example embodiments, there may be any number of sequential processes (e.g., three laser ablation processes, followed by a wet etch process) to remove the full depth of the molding material 608 to form the hole and/or trenches of the through-molding interconnect 610.

Next, the holes and/or trenches may be filled with a conductive material (e.g., electroplated copper, electroless copper, aluminum, conductive paste, solder paste, etc.), such that a portion of the conductive material protrudes past a top surface of the molding 608. In this way, the protrusions may form a mechanism for package-to-board interconnection. When the wireless module 600 is mounted to a PCB 618 in this manner by using through-molding contacts 610, the semiconductor package 602 may have contact with the antenna package 614 on the side opposing the molding 608. In some example embodiments, additional vias and/or trenches may be formed in the molding 608 to enclose dies 606 provided on the semiconductor package 602. In this way, electromagnetic interference (EMI) shielding may be formed in the molding. In some cases, such an EMI shielding may be formed at the same time as forming the through-molding contacts. In some example embodiments, underfill may be provided between wireless module 600 and the PCB 618.

Figure 7:
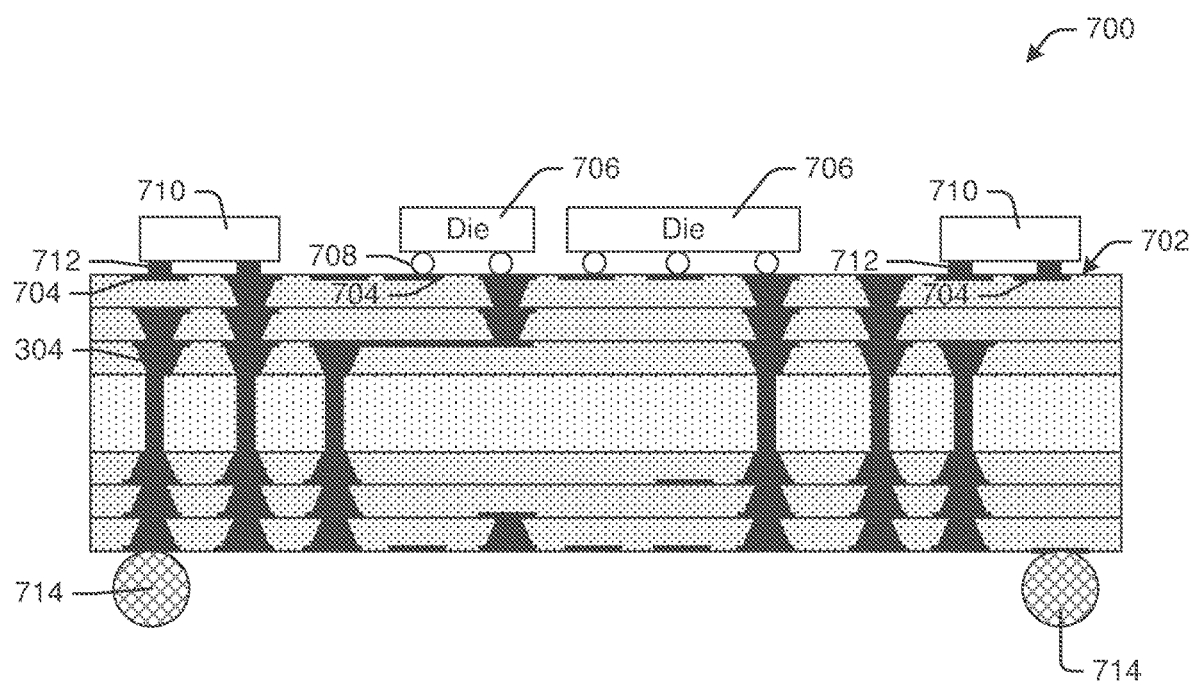
FIG. 7 depicts a simplified cross-sectional schematic diagram illustrating a configuration of a wireless module having antenna array elements disposed on a semiconductor package, in accordance with example embodiments of the disclosure.

FIG. 7 depicts a simplified cross-sectional schematic diagram illustrating a configuration of a wireless module 700 having antenna array elements 710 disposed on a semiconductor package 702, in accordance with example embodiments of the disclosure. In these example embodiments, the radiative, antenna array elements 710 may be any suitable type of radiative element, such as a patch antenna element. These antenna elements 710 may be placed and bonded onto respective surface pads 704 of the semiconductor package 702. Additionally, dies 706 may be placed and bonded onto the semiconductor package 702 via any suitable die-to-package contact 708. Any suitable contacts 712 (e.g., copper pillar, flip-chip, etc.), may be used to attach the antenna array elements 710 to corresponding pads 712 of the semiconductor package 702. Package-to-board interconnects 714 may be formed to make contact between the semiconductor package 702 and a board. In example embodiments, the antenna array elements 710 may be assembled directly on a surface of the semiconductor package and there may be an antenna package also attached to the semiconductor package 702. In other words, there may be radiative elements provided on both sides (e.g., antenna package on the bottom surface and assembled antenna array elements 710 on the top surface) of the semiconductor package 702.

Figure 8:
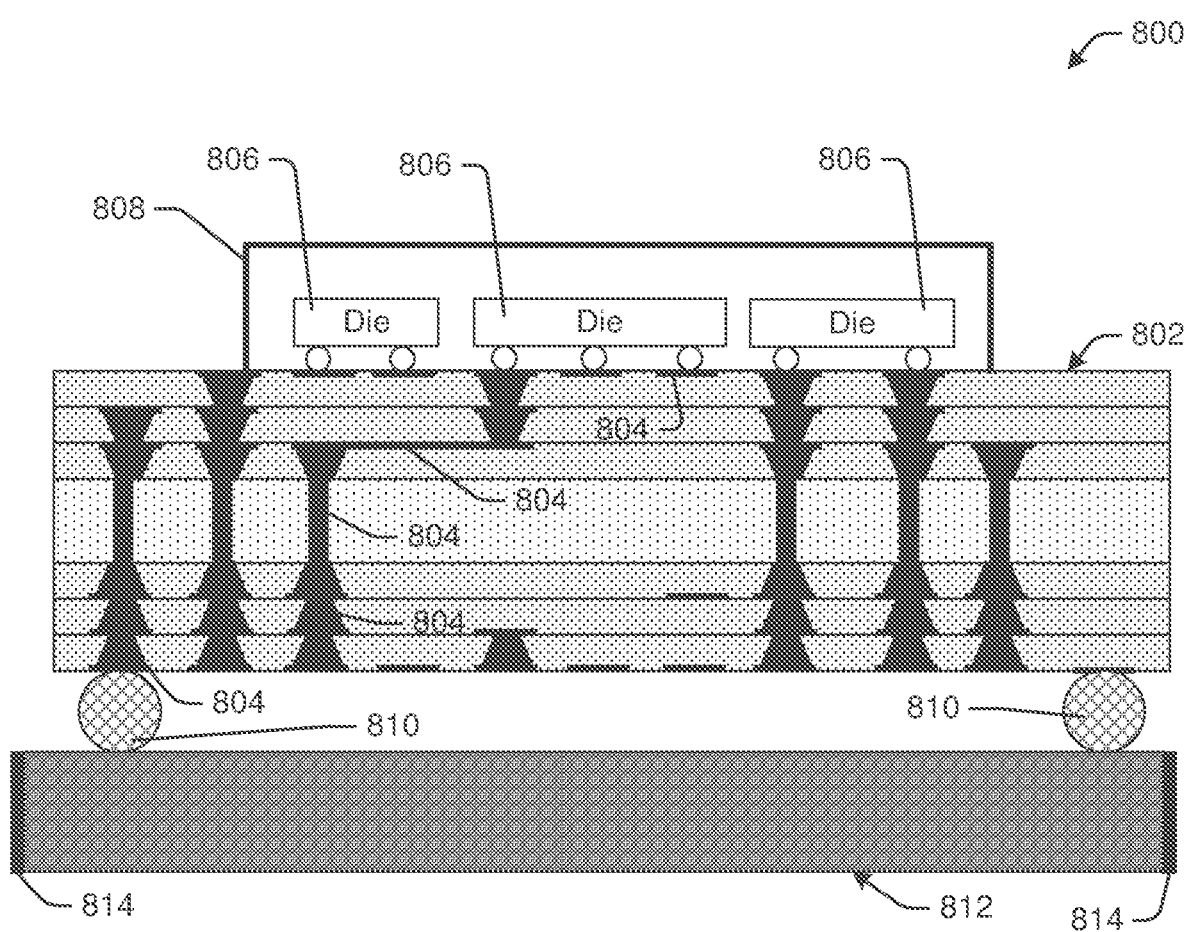
FIG. 8 depicts a simplified cross-sectional schematic diagram illustrating a configuration of a wireless module with antenna radiating elements disposed on a printed circuit board, in accordance with example embodiments of the disclosure.

FIG. 8 depicts a simplified cross-sectional schematic diagram illustrating a configuration of a wireless module 800 with antenna radiating elements 814 disposed on a printed circuit board (PCB) 812, in accordance with example embodiments of the disclosure. The wireless module 800 may include a semiconductor package 802 having one or more electrical traces. The semiconductor package 802 may further have one or more dies 806 attached thereon and, optionally an EMI shield and/or lid 808. The semiconductor package 802 may further be electrically and mechanically connected to the PCB 812 via a plurality of package-to-board interconnects 810. The package-to-board interconnects 810 may allow the semiconductor package to exchange signals with the PCB 812. In example embodiments, signals received by the board 812 form the semiconductor package 802 may be signals to be transmitted wirelessly. These signals may be used to drive antenna elements 814 of PCB 812 to transmit wireless electromagnetic signals form the semiconductor package 802. Similarly, RF transmission may be received by the antenna elements 814 of PCB 812, and the corresponding signals may be provided to one or more of the dies 806 via the package-to-board interconnects 810 and the traces 804 of the semiconductor package 802.

Figure 9:
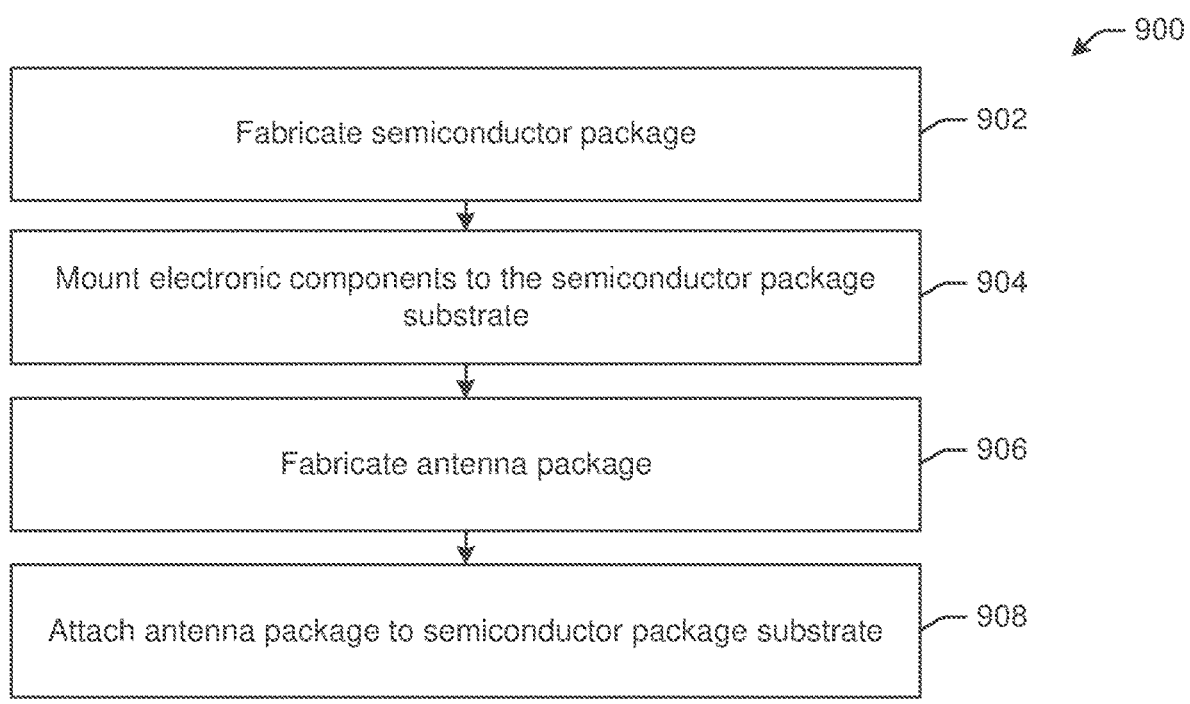
FIG. 9 depicts a flow diagram illustrating an example method for fabricating a wireless module having a package on an antenna package, in accordance with example embodiments of the disclosure.

FIG. 9 depicts a flow diagram illustrating an example method 900 for fabricating a wireless module having a package on an antenna package, in accordance with example embodiments of the disclosure. This method 900 may be used to fabricate any of the wireless modules depicted in the preceding figures. It will be appreciated that some processes may be performed in an order different from that depicted herein. It will further be appreciated that some processes may have suitable substitutes that may be implemented without deviating from embodiments of the disclosure.

At block 902, a semiconductor package may be fabricated. In example embodiments, the semiconductor package may be fabricated in the form of a panel that is subsequently singulated into individual semiconductor packages. The semiconductor package may include a core and multiple build-up layers with interconnects on one or both sides of the core. The interconnects may define electrical pathways for signals to/from electrical components that are to be mounted on the semiconductor package, as well as signals being routed to a board, and/or signals being routed to an antenna package. The semiconductor package may have any suitable number of interconnect layers and may further include package-to-board interconnects, such as BGA, LGA, or the like.

At block 904, electronic components may be mounted to the semiconductor package substrate. This process may include a pick-and-place system to align the electronic components to the semiconductor package. Any suitable mechanism of attachment (e.g., copper pillar, flip-chip, ACF, NCF, etc.) may be used for mounting the electronic components to the semiconductor package. The electronic components may be any suitable electronic components, such as ICs, RFICs, microcontrollers, baseband chips, microprocessors, memory chips, surface mount devices (SMDs), discrete components, transistors, diodes, resistors, inductors, capacitors, combinations thereof, or the like.

At block 906, an antenna package may be fabricated. As described above, the antenna package may have any suitable number of interconnect layers and may have pads for receiving and/or sending signals from/to the semiconductor package. The antenna package may further have a plurality of radiative antenna elements for transmitting and/or receiving wireless (e.g., RF, millimeter wave, 60 GHz, etc.) signals.

At block 908, the antenna package may be attached to the semiconductor package. Alternatively, the semiconductor package may be attached to the antenna package. The attachment may use any suitable mechanism, such as metallic bonding, epoxy, adhesive, mechanical, lamination, combinations thereof, or the like.

It should be noted, that the method 900 may be modified in various ways in accordance with certain embodiments of the disclosure. For example, one or more operations of the method 900 may be eliminated or executed out of order in other embodiments of the disclosure. Additionally, other operations may be added to the method 900 in accordance with other embodiments of the disclosure.

Figure 10:
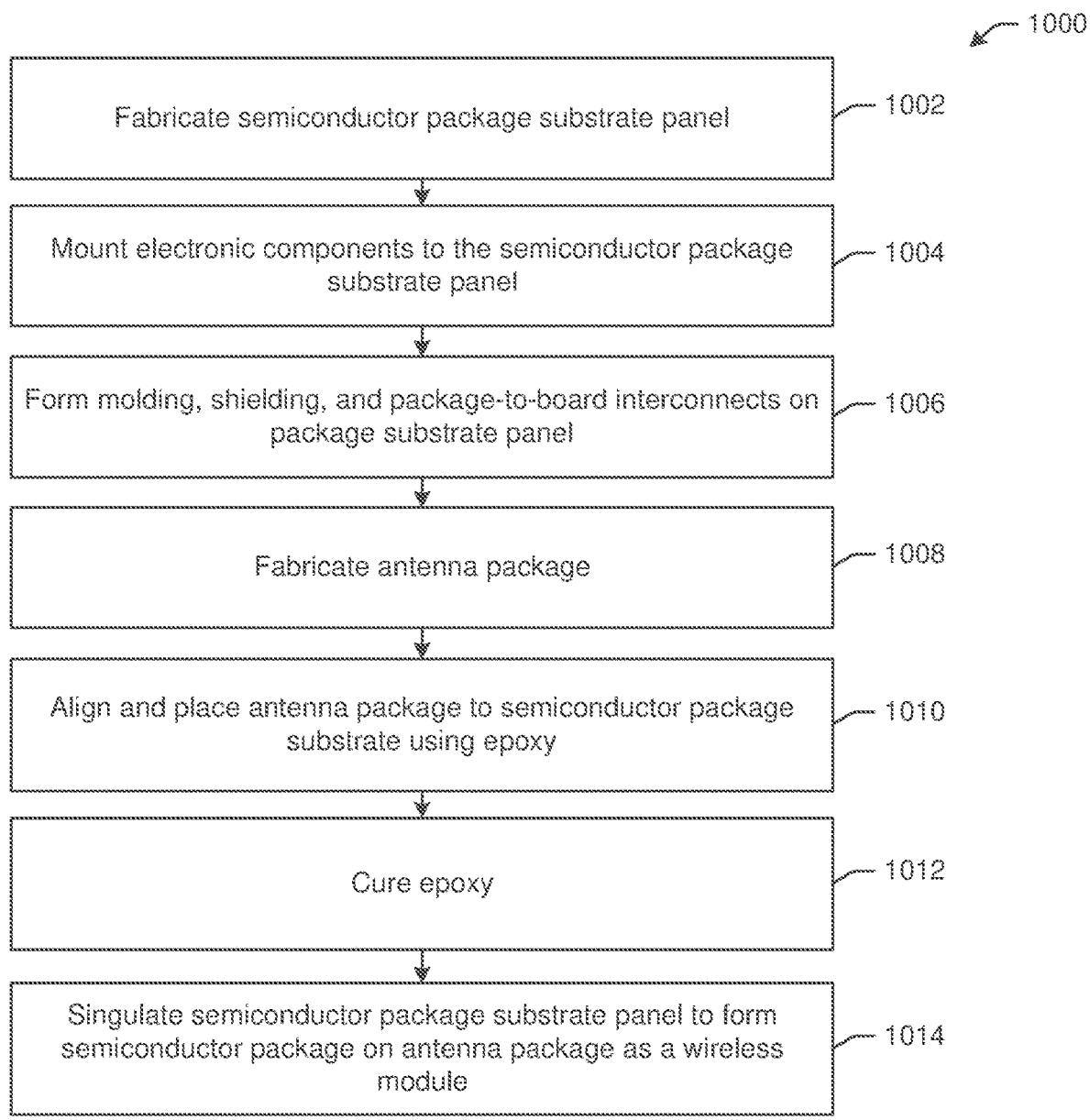
FIG. 10 depicts a flow diagram illustrating another example method for fabricating a wireless module, in accordance with example embodiments of the disclosure.

FIG. 10 depicts a flow diagram illustrating another example method 1000 for fabricating a wireless module, in accordance with example embodiments of the disclosure. This method 1000 may be used to fabricate any of the wireless modules depicted in the preceding figures where the antenna package and the semiconductor package are joined with epoxy. It will be appreciated that some processes may be performed in an order different from that depicted herein. It will further be appreciated that some processes may have suitable substitutes that may be implemented without deviating from embodiments of the disclosure.

At block 1002, a semiconductor package substrate panel may be fabricated. In example embodiments, the semiconductor package panel may have a plurality of semiconductor packages fabricated thereon. The semiconductor package substrate panel may be fabricated by building layers of interconnect traces. In some example embodiments, the panel may include a core and multiple build-up layers with interconnects on one or both sides of the core. In other cases, a coreless integration may be used. The interconnects may define electrical pathways for signals to/from electrical components that are to be mounted on the semiconductor package, as well as signals being routed to a board, and/or signals being routed to an antenna package.

At block 1004, electronic components may be mounted to the semiconductor package substrate panel. This process may include a pick-and-place system to align the electronic components to the semiconductor package. Any suitable mechanism of attachment (e.g., copper pillar, flip-chip, ACF, NCF, etc.), may be used for mounting the electronic components to the semiconductor package. The electronic components may be any suitable electronic components, such as ICs, RFICs, microcontrollers, baseband chips, microprocessors, memory chips, surface mount devices (SMDs), discrete components, transistors, diodes, resistors, inductors, capacitors, combinations thereof, or the like. At block 1006, molding, shielding, and package-to-board interconnects may be formed on the package substrate panel.

At block 1008, an antenna package may be fabricated. The antenna packages may be fabricated on a panel and then singulated to form a plurality of antenna packages from a single antenna package substrate. As described above, the antenna package may have any suitable number of interconnect layers and may have pads for receiving and/or sending signals from/to the semiconductor package. The antenna package may further have a plurality of radiative antenna elements for transmitting and/or receiving wireless (e.g., RF, millimeter wave, 60 GHz, etc.) signals.

At block 1010, the antenna package may be aligned and placed on to the semiconductor package substrate and held using epoxy. The alignment may be performed with a pick-and-place system to align corresponding pads of the semiconductor package substrate and the antenna package. At block 1012 the epoxy may be cured. At block 1014, the semiconductor package substrate may be singulated to form the semiconductor package on antenna package as a wireless module.

It should be noted that the method 1000 may be modified in various ways in accordance with certain embodiments of the disclosure. For example, one or more operations of the method 1000 may be eliminated or executed out of order in other embodiments of the disclosure. Additionally, other operations may be added to the method 1000 in accordance with other embodiments of the disclosure.

It will be appreciated that the apparatus described herein may be any suitable type of microelectronics packaging and configurations thereof, including, for example, system in a package (SiP), system on a package (SOP), package on package (PoP), interposer package, 3D stacked package, etc. In fact, any suitable type of microelectronic components may be provided in the semiconductor packages, as described herein. For example, microcontrollers, microprocessors, baseband processors, digital signal processors, memory dies, field gate arrays, logic gate dies, passive component dies, MEMSs, surface mount devices, application specific integrated circuits, baseband processors, amplifiers, filters, combinations thereof, or the like may be packaged in the semiconductor packages, as disclosed herein. The semiconductor packages, as disclosed herein, may be provided in any variety of electronic device including consumer, industrial, military, communications, infrastructural, and/or other electronic devices.

The semiconductor package, as described herein, may be used to house one or more processors. The one or more processors may include, without limitation, a central processing unit (CPU), a digital signal processor(s) (DSP), a reduced instruction set computer (RISC), a complex instruction set computer (CISC), a microprocessor, a microcontroller, a field programmable gate array (FPGA), or any combination thereof. The processors may also include one or more application specific integrated circuits (ASICs) or application specific standard products (ASSPs) for handling specific data processing functions or tasks. In certain embodiments, the processors may be based on an Intel® Architecture system and the one or more processors and any chipset included in an electronic device may be from a family of Intel® processors and chipsets, such as the Intel® Atom® processor(s) family or Intel-64 processors (e.g., Sandy Bridge®, Ivy Bridge®, Haswell®, Broadwell®, Skylake®, etc.).

Additionally or alternatively, the semiconductor package, as described herein, may be used to house one or more memory chips. The memory may include one or more volatile and/or non-volatile memory devices including, but not limited to, magnetic storage devices, read-only memory (ROM), random access memory (RAM), dynamic RAM (DRAM), static RAM (SRAM), synchronous dynamic RAM (SDRAM), double data rate (DDR) SDRAM (DDR-SDRAM), RAM-BUS DRAM (RDRAM), flash memory devices, electrically erasable programmable read-only memory (EEPROM), non-volatile RAM (NVRAM), universal serial bus (USB) removable memory, or combinations thereof.

In example embodiments, the electronic device in which the semiconductor package is provided may be a computing device. Such a computing device may house one or more boards on which the semiconductor package connections may be disposed. The board may include a number of components including, but not limited to, a processor and/or at least one communication chip. The processor may be physically and electrically connected to the board through, for example, electrical connections of the semiconductor package. The computing device may further include a plurality of communication chips. For instance, a first communication chip may be dedicated to shorter range wireless communications such as Wi-Fi and Bluetooth, and a second communication chip may be dedicated to longer range wireless communications such as GPS, EDGE, GPRS, CDMA, WiMAX, LTE, EV-DO, and others. In various example embodiments, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, combinations thereof, or the like. In further example embodiments, the computing device may be any other electronic device that processes data.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

While the disclosure includes various embodiments, including at least a best mode, it is to be understood that many alternatives, modifications, and variations will be apparent to those skilled in the art in light of the foregoing description. Accordingly, the disclosure is intended to embrace all such alternatives, modifications, and variations, which fall within the scope of the included claims. All matters disclosed herein or shown in the accompanying drawings are to be interpreted in an illustrative and non-limiting sense.

This written description uses examples to disclose certain embodiments of the disclosure, including the best mode, and also to enable any person skilled in the art to practice certain embodiments of the disclosure, including making and using any apparatus, devices or systems and performing any incorporated methods and processes. The patentable scope of certain embodiments of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

According to example embodiments of the disclosure, there may be a wireless module. The wireless module may include a semiconductor package having at least one electronic component provided thereon and a first coupling pad; and an antenna package attached to the semiconductor package and having at least one radiative element and a second coupling pad, the second coupling pad communicatively coupled with the first coupling pad, the at least one radiative element configured to wirelessly transmit or receive a signal. In some example embodiments, the wireless module, further includes an epoxy layer disposed between the semiconductor package and the antenna package. In further example embodiments, the first coupling pad is at least one of inductively or capacitively coupled to the second coupling pad. In still further example embodiments, the antenna package is attached to the semiconductor package with one or more metallic interconnects. In still further embodiments, the wireless module may further include an underfill disposed between the semiconductor package and the antenna package, wherein the underfill encapsulates the metallic interconnects.

According to example embodiments of the disclosure, the wireless module the radiative element includes a patch antenna element. In further example embodiments, the semiconductor package further includes an electromagnetic shield provided around the at least one electronic component. In still further example embodiments, the antenna package comprises one or more discrete electrical components disposed thereon. In some example embodiments, the wireless module may include an interposer disposed on the semiconductor package, wherein the interposer comprises a first interconnect to the semiconductor package and an interposer-to-board interconnect. In further example embodiments, there may be a molding encapsulating the at least one electronic component, the molding having a conductive pillar extending from a first side of the molding to a second side of the molding and protruding, at least in part, beyond the second side of the molding, the second side opposing the first side, wherein the conductive pillar is electrically coupled to a first contact pad on the semiconductor package. In yet further example embodiments, the at least one radiative elements is a first set of radiative elements, and wherein the wireless module further comprises a second set of radiative elements disposed on the semiconductor package.

According to example embodiments of the disclosure, there may be a method. The method may include forming a semiconductor package having a first top surface and a first bottom surface opposing the first top surface, wherein the first top surface includes a connection pad and the first bottom surface includes a first coupling pad; forming an antenna package, the antenna package having a second top surface and a second bottom surface opposing the second top surface, wherein the second top surface includes a second coupling pad and the second bottom surface includes a radiative element; attaching a die to the connection pad; and attaching the semiconductor package to the antenna package. In some example embodiments, forming the semiconductor package includes providing a packaging core having a first core surface and a second core surface; forming through-vias in the packaging core; forming a first build-up layer overlying the first core surface, wherein the connection pad is formed on the first build-up layer; and forming a second build-up layer overlying the second core surface, wherein the first coupling pad is formed on the second build-up layer. In further example embodiments, forming the semiconductor package comprises forming a first one or more build-up layers, wherein forming the antenna package comprises forming a second one or more build-up layers, and wherein a number of the first one or more build-up layers is different from a number of the second one or more build-up layers.

In accordance with example embodiments, attaching the semiconductor package to the antenna package includes providing epoxy on the first bottom surface; aligning and placing the antenna package such that the first coupling pad substantially aligns with the second coupling pad; and curing the epoxy. In some example embodiments, attaching the semiconductor package to the antenna package includes forming a package-to-package interconnect on the second coupling pad; aligning and placing the antenna package such that the first coupling pad substantially aligns with the package-to-package interconnect; and forming a bond between the package-to-package interconnect and the first coupling pad. In further example embodiments, the method may further include forming an underfill between the semiconductor package and the antenna package, the underfill encapsulating the package-to-package interconnect. In still further example embodiments, the method may include providing an electromagnetic shield at least partially encompassing the die. In some further example embodiments, the method may include forming a molding overlying at least a portion of the first top surface and encapsulating the die; and forming a hole in the molding; and filling the hole with a conductive material. In yet further example embodiments, the conductive material is a first conductive material and the method further including forming a trench in the molding surrounding the die; and depositing a second conductive material within the trench.

What is claimed is:

1. A wireless module, comprising:
   a semiconductor package having at least one electronic component provided thereon, the semiconductor package also having a first dielectric material, the first dielectric material having a first dielectric constant; and
   an antenna package having a radiative element in communication with the electrical component, the radiative element configured to wirelessly transmit or receive a signal, the antenna package also having a second dielectric material, the second dielectric material having a second dielectric constant that is different than the first dielectric constant.

2. The wireless module of claim 1, further comprising an epoxy layer disposed between the semiconductor package and the antenna package.

3. The wireless module of claim 1, wherein the antenna package is attached to the semiconductor package with one or more metallic interconnects.

4. The wireless module of claim 3, further comprising an underfill disposed between the semiconductor package and the antenna package, wherein the underfill encapsulates the metallic interconnects.

5. The wireless module of claim 1, wherein the radiative element comprises a patch antenna element.

6. The wireless module of claim 1, wherein the semiconductor package is attached to the antenna package.

7. The wireless module of claim 1, wherein the semiconductor package is attached to a printed circuit board (PCB) and the antenna package is also attached to the PCB.

8. The wireless module of claim 1, further comprising an interposer disposed on the semiconductor package, wherein the interposer comprises a first interconnect to the semiconductor package and an interposer-to-board interconnect.

9. The wireless module of claim 1, further comprising a molding encapsulating the at least one electronic component, the molding having a conductive pillar extending from a first side of the molding to a second side of the molding and protruding, at least in part, beyond the second side of the molding, the second side opposing the first side, wherein the conductive pillar is electrically coupled to a first contact pad on the semiconductor package.

10. The wireless module of claim 1, wherein the radiative elements is a first part of an antenna, and wherein the wireless module further comprises a second part of the antenna disposed on the semiconductor package, and separate from the first part of the antenna.

11. A method, comprising:
forming a semiconductor package having at least one electronic component provided thereon, the semiconductor package also having a first dielectric material, the first dielectric material having a first dielectric constant;
forming an antenna package having a radiative element in communication with the electrical component, the radiative element configured to wirelessly transmit or receive a signal, the antenna package also having a second dielectric material, the second dielectric material having a second dielectric constant that is different than the first dielectric constant; and
attaching the semiconductor package to the antenna package.

12. The method of claim 11, wherein forming the semiconductor package comprises:
providing a packaging core having a first core surface and a second core surface;
forming through-vias in the packaging core;
forming a first build-up layer overlying the first core surface, wherein a connection pad is formed on the first build-up layer; and
forming a second build-up layer overlying the second core surface, wherein a first coupling pad is formed on the second build-up layer.

13. The method of claim 11, wherein forming the semiconductor package comprises forming a first one or more build-up layers, wherein forming the antenna package comprises forming a second one or more build-up layers, and wherein a number of the first one or more build-up layers is different from a number of the second one or more build-up layers.

14. The method of claim 11, wherein attaching the semiconductor package to the antenna package comprises:
providing epoxy on the semiconductor package;
aligning and placing the antenna package such that a first coupling pad substantially aligns with a second coupling pad; and
curing the epoxy.

15. The method of claim 11, wherein attaching the semiconductor package to the antenna package comprises:
forming a package-to-package interconnect on a second coupling pad;
aligning and placing the antenna package such that a first coupling pad substantially aligns with the package-to-package interconnect; and
forming a bond between the package-to-package interconnect and the first coupling pad.

16. The method of claim 15, further comprising forming an underfill between the semiconductor package and the antenna package, the underfill encapsulating the package-to-package interconnect.

17. The method of claim 11, further comprising providing an electromagnetic shield at least partially encompassing a die.

18. The method of claim 11, further comprising:
forming a molding overlying at least a portion of the semiconductor package and encapsulating a die; and
forming a hole in the molding; and
filling the hole with a conductive material.

19. The method of claim 18, wherein the conductive material is a first conductive material and the method further comprising:
forming a trench in a molding surrounding the die; and
depositing a second conductive material within the trench.

* * * * *